United States Patent [19]

Bansal et al.

[11] Patent Number: 4,467,518
[45] Date of Patent: Aug. 28, 1984

[54] PROCESS FOR FABRICATION OF STACKED, COMPLEMENTARY MOS FIELD EFFECT TRANSISTOR CIRCUITS

[75] Inventors: Jai P. Bansal, Manassas, Va.; Claude L. Bertin, S. Burlington; Ronald R. Troutman, Essex Junction, both of Vt.

[73] Assignee: IBM Corporation, Armonk, N.Y.

[21] Appl. No.: 464,235

[22] Filed: Feb. 7, 1983

Related U.S. Application Data

[62] Division of Ser. No. 265,001, May 19, 1981.

[51] Int. Cl.³ .................. H01L 21/265; H01L 21/225
[52] U.S. Cl. ..................................... 29/571; 29/576 B; 29/576 J; 29/577 C; 148/187; 148/188
[58] Field of Search .................. 29/571, 576 B, 576 J, 29/577 C; 148/1.5, 187, 188; 357/42

[56] References Cited

U.S. PATENT DOCUMENTS

| | | | |
|---|---|---|---|
| 4,090,915 | 5/1978 | Keller | 148/188 |
| 4,272,880 | 6/1981 | Pashley | 29/571 |
| 4,305,973 | 12/1981 | Yaron et al. | 148/1.5 X |
| 4,335,504 | 6/1982 | Lee | 148/187 X |
| 4,351,674 | 9/1982 | Yoshida et al. | 29/576 B |

OTHER PUBLICATIONS

Gibbons et al., *IEEE Electron Device Letters*, "One-Gate-Wide CMOS Inverter on Laser-Recrystallized Polysilicon", vol. EDL-1, No. 6, Jun. 1980.

*Primary Examiner*—G. Ozaki
*Attorney, Agent, or Firm*—John E. Hoel

[57] ABSTRACT

A method is disclosed for fabricating series and/or parallel connected P channel and N channel FET device topologically connected in a CMOS configuration, where the individual FET devices share a common gate sandwiched between them, forming a five terminal device. A new device structure and complementary MOSFET circuitry is also disclosed. The disclosed process produces devices and circuits which overcome the main disadvantage of prior art CMOS transistors, namely excessive area consumption and parasitic effects.

8 Claims, 45 Drawing Figures

PROCESS FOR FABRICATION OF STACKED, COMPLEMENTARY MOS FIELD EFFECT TRANSISTOR CIRCUITS

This is a division of application Ser. No. 265,001 filed May 19, 1981.

FIELD OF THE INVENTION

The invention disclosed broadly relates to semiconductor devices and more particularly relates to device structures and methods of fabrication for MOSFET devices.

BACKGROUND OF THE INVENTION

IGFET inverter circuits employing a pair of complementary IGFET devices (CMOS) have been widely employed in the prior art, as is shown in FIG. 1. The CMOS inverter 2 shown in FIG. 1 includes an N channel enhancement mode transistor 4' connected at 164 to the least positive voltage supply 3 and a P channel enhancement transistor 6' connected at 14' to the most positive voltage supply 7, with the common drains 17' and 13' being the output 5. The gate 8' of the P channel device 6' and the gate 10' of the N channel device 4' are connected together and receive the input signal at the terminal 12. When the input signal at 12 is down, the N channel enhancement mode device 4' is turned off and the P channel enhancement mode device 6' is turned on so that the output at 5 is at the level of the most positive supply voltage 7. When the input signal at the input 12 is high, the N channel device 4' is on and the P channel device 6' is off, resulting in the output 5 being at the level of the least positive supply voltage 3. Since one of the devices 4' or 6' of the pair in the circuit 2 is always off during their steady state, this type of circuit dissipates power only during its switching transients. The principal technique for forming CMOS circuits in the prior art is to select a particular conductivity type substrate, for example an N-type substrate and then form first channel type devices, in this example P channel type devices by directly depositing P-type doped regions as the source and drain of the P channel devices into the N-type substrate. Then to form the other channel type or N channel devices, a relatively large island structure had to be formed in the substrate, in this example, for N channel devices in an N-type substrate, a P-type island would have to be formed and then the N-type conductivity source and drain regions be subsequently formed in the P-type island region. Only in this manner could both channel types of FET devices be formed in the same conductivity type semiconductor substrate. Although CMOS circuits having useful properties could be formed with this technique, there were significant accompanying disadvantages, namely that the island region formed in the semiconductor substrate took up a substantially larger area than did the actual FET device formed within it and secondly that the island structure would form parasitic bipolar transistors with other adjacent structures in the semiconductor substrate, producing unwanted electrical characteristics in the overall circuit. The paired wiring of gates for the N channel and P channel devices in conventional CMOS technology consumes considerable silicon real estate.

A suggestion for a solution to this problem was made by K. E. Kroell in his article "Integrated CMOS Structure," in the *IBM Technical Disclosure Bulletin*, Volume 15, No. 9, Feb. 1973, pages 2856–2857, wherein he describes a shared gate, stacked CMOS structure wherein a pair of oppositely conductive FETs are superimposed upon each other so that the semiconductor space is required for only one MOSFET device. Kroell describes an N channel FET device being formed in a P-type silicon substrate by diffusing N-type source and drain regions directly into the substrate. After covering the channel region with a gate oxide insulator, Kroell deposits a metallization layer of temperature resistant metal and etches a conductor pattern for the common gate electrode and the remaining source and drain contacts for both the N channel device already formed in the substrate and the P channel device to be formed on top of the N channel device. Kroell then deposits a second gate insulating layer on top of the conductive metal gate already deposited on the channel of the N channel device, and then deposits a silicon layer of N-type conductivity on top of the assembly. Kroell then forms the P-type source and drain regions in the upper, N-type silicon layer by either diffusion or ion implantation processes, thereby forming a P channel device which is stacked on top of the N channel device and shares a common gate electrode.

The stacked CMOS structure disclosed by Kroell has a number of practical limitations in its operating characteristics, its amenability to large scale integrated circuit layouts, and its method of fabrication. For example, the N channel device described by Kroell is not self-aligned with respect to its gate. Furthermore, some refractory metals described by Kroell in his structure, such as molybdenum, have serious corrosion problems. With respect to Kroell's P channel device, it too is not self-aligned with its gate. Furthermore, photolithographic tolerances will limit the minimum size of the device since there are two alignment steps which are required in determining the channel length of the P channel device. Furthermore, the wirability of devices formed with Kroell's technique is limited due to the single level of interconnection using refractory metal, which he discloses. Still further, the P channel device formed by Kroell has a poor hole mobility and a high junction leakage characteristic because of its fabrication in polycrystalline silicon, as is implied by Kroell. Finally, there are fabrication difficulties which could lead to gate integrity problems.

OBJECTS OF THE INVENTION

It is therefore an object of the invention to provide an improved stacked CMOS structure.

It is another object of the invention to provide an improved stacked CMOS structure which is more amenable to layouts in a large scale integrated circuit.

It is still a further object of the invention to provide an improved process for the formation of a stacked CMOS structure and large scale integrated circuit.

It is yet a further object of the invention to provide improved circuits using the improved stacked CMOS five terminal device structure.

It is yet another object of the invention to provide low power circuits which will dissipate very little power and yet match or exceed NMOS circuits in their density and performance.

It is still a further object of the invention to provide a compact, very low power flip-flop storage cell using two stacked CMOS devices.

SUMMARY OF THE INVENTION

These and other objects, features and advantages of the invention are accomplished by the structure, layout, and method formation of same disclosed herein. A method is disclosed for fabricating series and/or parallel connected P channel and N channel FET devices topologically connected in a CMOS configuration, where the individual FET devices share a common gate sandwiched between them, forming a five terminal device. A new device structure and complementary MOSFET circuitry is also disclosed. The disclosed process produces devices and circuits which overcome the main disadvantage of prior art CMOS transistors, namely excessive area consumption and parasitic effects. Other advantages of the invention include both the N channel and P channel devices being self-aligned to the same gate electrode. Furthermore, as many as three different levels of wiring are available, namely the N+ polysilicon gate layer, the P-type polysilicon laser annealed silicon (LAS) layer, and the aluminum layer. Still other advantages of the invention include a better mobility for the P channel device comparable to that of P channel devices fabricated in bulk monocrystalline silicon. The mutually self-aligned P channel and N channel devices provide less overlap capacitance, a better control of the width to length ratio, a smaller area for device layout, and enable a direct contact between the N+ diffusion and the P+ laser annealed silicon layer. Furthermore, the process sequence disclosed enables all polycrystalline silicon regions to remain connected to the substrate during the laser annealing operation, thereby insuring a more uniform recrystallization of the polycrystalline silicon layers, which are subsequently separated from the wafer by an etching step. In summary, the resulting device and fabrication process provides a substantial improvement over prior art CMOS technology.

DESCRIPTION OF THE FIGURES

These and other objects, features and advantages of the invention will be more fully appreciated with reference to the accompanying figures.

DISCUSSION OF THE PREFERRED EMBODIMENT

Figure 2:
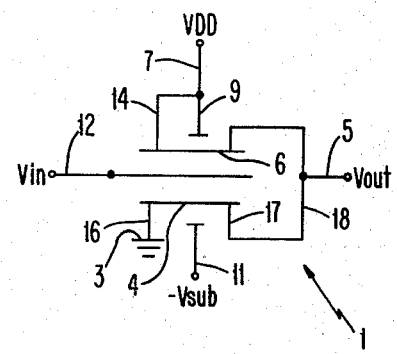
FIG. 2 is an electrical schematic diagram of the stacked CMOS device.
Figure 3A:
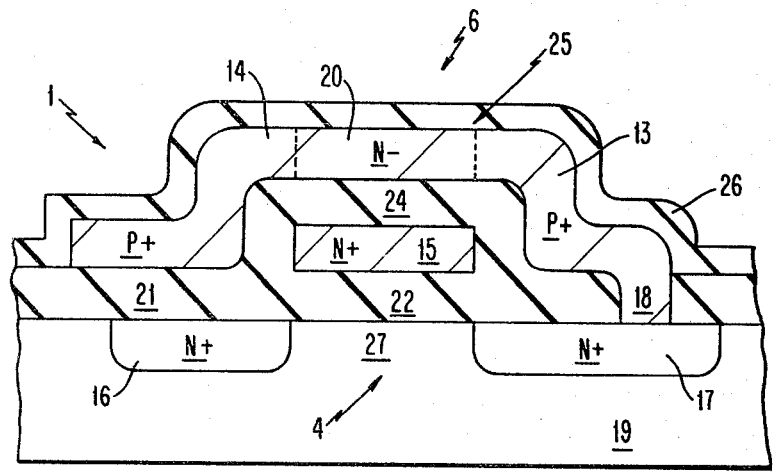
FIG. 3A is a cross-sectional view of the stacked CMOS device where the drain of the P channel device is connected to the drain of the N channel device.
Figure 3B:
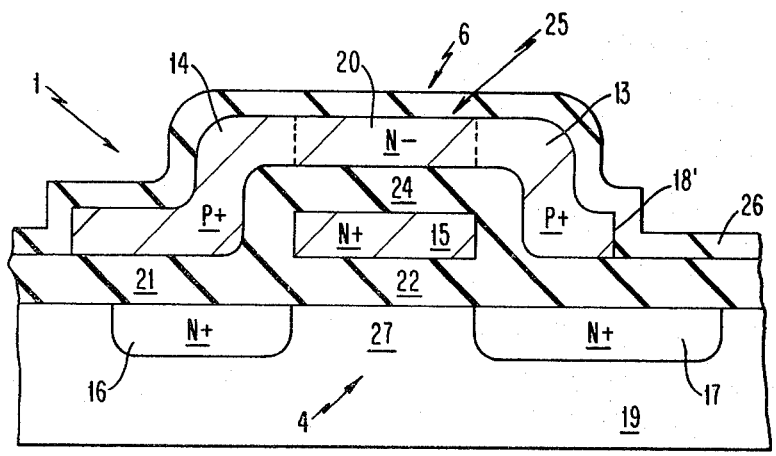
FIG. 3B is a cross-sectional view of a stacked CMOS device where the laser annealed silicon (LAS) layer of the P channel device is physically separated from the substrate containing the N channel device.

An electrical schematic diagram of the stacked CMOS device structure is shown in FIG. 2 and two alternate cross-sectional views of the device structure are shown in FIGS. 3A and 3B where like elements have the same numbering.

Figure 19:
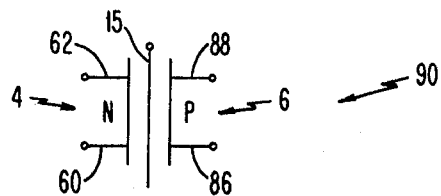
FIG. 19 is an electrical schematic diagram of the stacked CMOS device when considered as a five terminal device.

In the embodiment shown in FIG. 3a, the laser annealed silicon (LAS) layer 25 remains contacted at 18 to the N+ diffusion 17 while in the embodiment shown in FIG. 3B, the end 18' has been physically separated from the diffusion 17 by means of an etching step, for example. The structure in FIG. 3A has application in the formation of CMOS inverter circuits such as is schematically shown in FIG. 2. The structure of FIG. 3B has advantage in the formation of logic circuits and other circuits where the source-drain paths of consecutive like-channel devices are connected together, such as in the NOR circuit shown in FIG. 26. FIG. 3B shows the more general five terminal device which is schematically represented in FIG. 19, having as the five terminals, the source and the drain of the P channel device, the source and the drain of the N channel device and the gate common to both the N and P channel devices. In such a five terminal device, the substrate contacts can be left with their potentials floating or alternately, can be separately connected to a power supply or in a further alternate arrangement, can be electrically shorted to the corresponding source electrode via the contact from the aluminum layer to the source. This will become clearer as the description of the invention unfolds.

A silicon semiconductor substrate 19 of P-type conductivity is connected by means of the terminal 11 to a negative substrate voltage Vsub. An N+ type source diffusion 16 is connected by means of the terminal 3 to ground potential or to another device terminal and an N+ type drain diffusion 17 is connected by means of the terminal 5 to the output of the circuit. The region 27 between the source 16 and drain 17 forms the channel 27 of the N channel FET device. A layer of silicon dioxide 21 is formed over the surface of the substrate 19 and a layer 15 of polycrystalline silicon is deposited at 22' to form the gate electrode for the N channel FET device 4. A second silicon dioxide layer 24 is formed over the polycrystalline silicon gate 15 and then a second layer of polycrystalline silicon generally shown as 25 is deposited on top of the layer 24 so that a first end 18 thereof physically and electrically contacts the drain diffusion 17 of the N channel FET device 4. By means of process steps which will be described later, the polycrystalline silicon layer 25 is converted to a monocrystalline silicon layer, the end 18 thereof is doped P positive, the region 20 located above the polycrystalline silicon gate electrode 15 is doped N−, and the region 14 remote from the end 18 and adjacent to the central portion 20 is doped P+. The regions 14 and 13 in the silicon layer 25 serve as the source and drain, respectively of a P channel FET device 6 whose channel region is formed by the intermediate N− doped region 20. Conduction from the source 14 to the drain 18 is achieved by a relatively negative potential between the gate electrode 15 and the source 14 of the P channel FET device 6. The device is completed by the deposition of an upper layer of silicon dioxide 26 which insulates the laser annealed silicon layer from the aluminum layer and forms, in conjunction with the recessed oxide, the field oxide for the device.

The N channel transistor 4 is a conventional silicon gate N channel structure. However the P channel transistor 6 is fabricated upside down from the conventional manner, above the same polycrystalline silicon gate 15. The power for the P channel device 6 is usually applied via an aluminum line contacted to the source 14 of the P channel device and is shown as the drain voltage VDD or as coming from another device. As in conventional complementary MOS circuits wherein the P channel and N channel FET devices have their gates connected to the same input, either one or the other of the two FET devices 4 or 6 is on, depending upon the relative polarity of the input gate voltage at 15. The stacked CMOS device 1 can be considered a five terminal device having a schematic diagram as indicated in FIG. 19. The sandwiched structure can be integrated to a conventional N channel process. Circuit layouts of the structure for typical logic functions demonstrate densities which exceed conventional N channel logic and have a far superior power-delay product.

Several processes will be disclosed which are directed to obtaining good FET device characteristics for the upper P channel transistor. These improved characteristics include a low leakage current, proper threshold voltage, and a self-alignment with the common sandwiched gate electrode as is the case for the lower N channel transistor. The process should produce a structure which provides efficient wiring routing to enable compact placement of the wiring and devices in a large scale integrated circuit chip.

Figure 4:
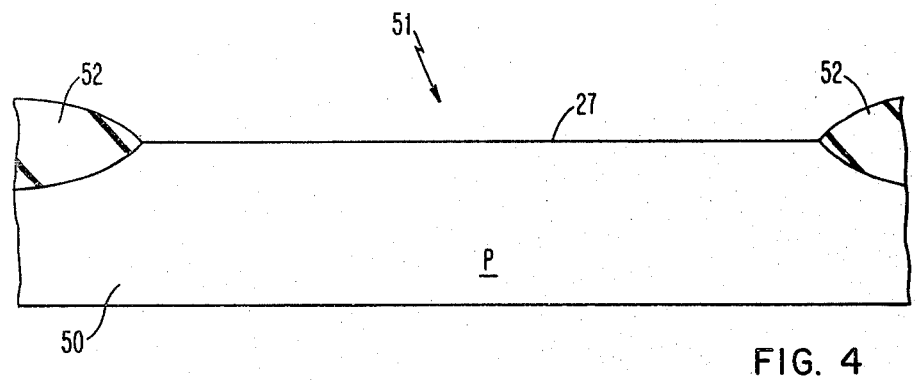
FIGS. 4 through 17 illustrate the sequence of process steps to fabricate the stacked CMOS device.

The process steps shown for forming the stacked CMOS device are illustrated in the sequence of figures from FIG. 4 through FIG. 17. FIG. 4 illustrates a starting step wherein the monocrystalline silicon P-type substrate 50 which has a starting resistivity of approximately 10 ohm centimeters, has formed in its surface the recessed oxide isolation regions 52, in a manner well known to the prior art. This defines an isolation area 51 in which the stacked CMOS device will be formed. In addition, the channel 27 has been ion implanted with boron ions (not shown) to obtain the correct threshold in a manner well known to the prior art.

Figure 5:
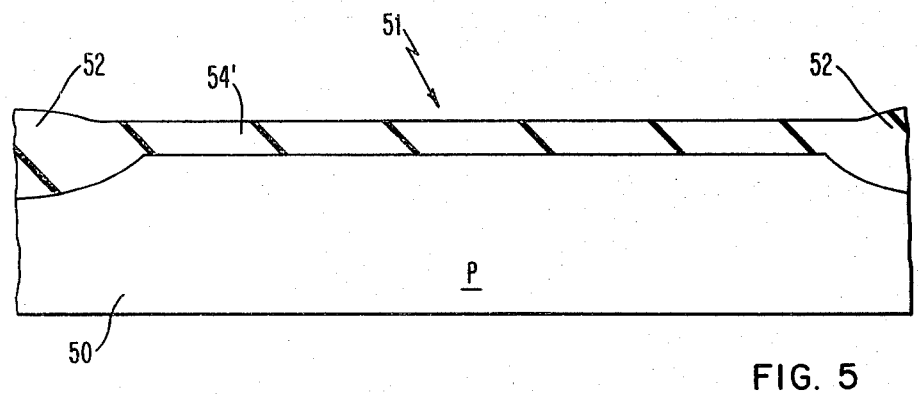

FIG. 5 illustrates the next step of growing the gate oxide layer 54' which is a silicon dioxide layer of between 25 and 100 nanometers thickness which can be thermally grown on the surface of the silicon semiconductor substrate 50 within the isolation area 51. At this point, contact holes can be etched through the silicon dioxide layer 54' in order to enable electrical contact to buried regions. This is to allow subsequent direct contacting of the N+ polycrystalline silicon gate to the drain of the N channel device.

Figure 6:
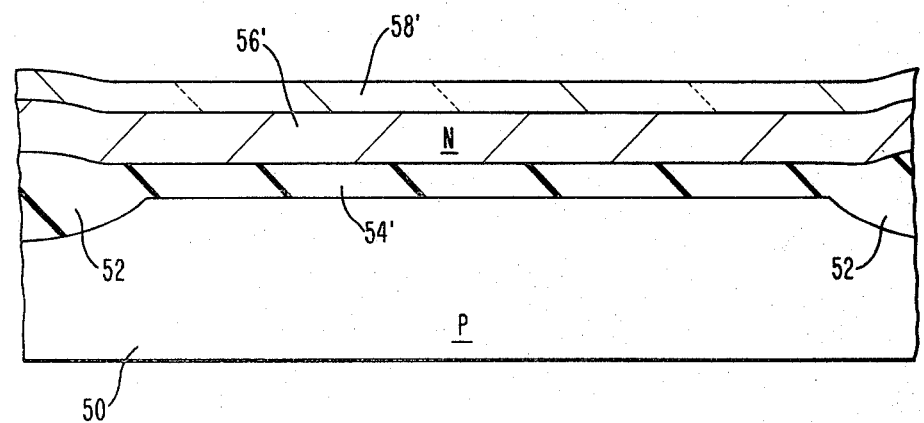

The next significant step is shown in FIG. 6 wherein an N-type doped polycrystalline silicon layer 56', having been doped for example with phosphorous, to a concentration of greater than $10^{19}$ atoms per cubic centimeter, is deposited to a thickness of from 400 to 1000 nanometers on the surface of the silicon dioxide gate layer 54'. A method of obtaining the P channel gate insulator would be to laser anneal the N+ polycrystalline silicon layer to smooth its upper surface. This would then be followed by the forming of a silicon dioxide layer of 10 to 50 nanometers. This is followed by the deposition of a 25-100 nanometers thick layer of phosphosilicate glass having a phosphorous concentration of approximately 2-4 mole percent which, in its etched form, will eventually provide the self-alignment of the upper transistor P channel gate, as will be subsequently described. The composite silicon dioxide/phosphosilicate glass is shown as 58'.

Figure 7:
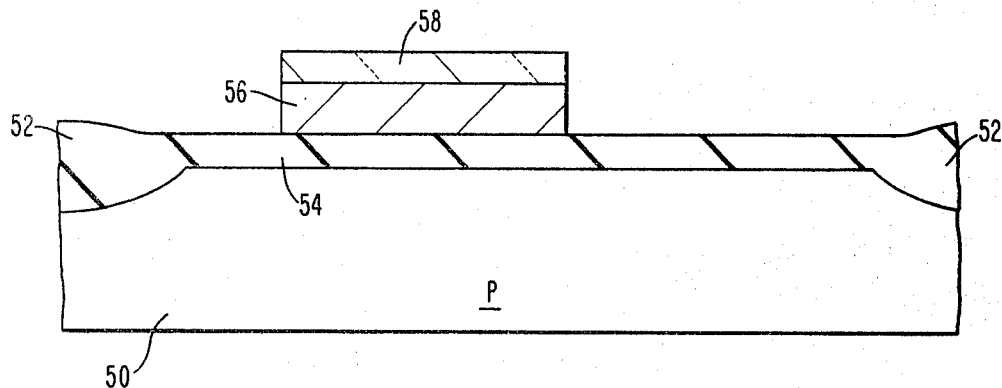

The next significant step is shown in FIG. 7 wherein the composite layer 58' and the polycrystalline silicon layer 56' are etched by means of a reactive ion etching technique or other suitable method, in order to form the polycrystalline silicon gate electrode 56 and the etched composite layer 58, as is shown in FIG. 7.

Figure 8:
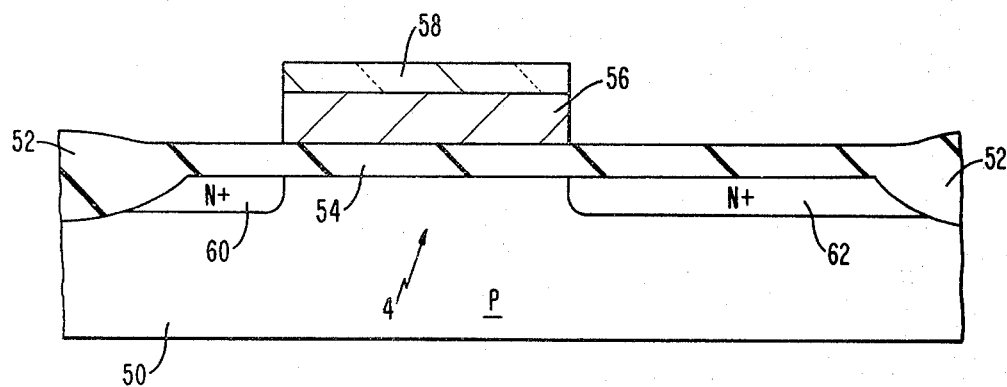

The next significant step is illustrated in FIG. 8 wherein the source region 60 and drain region 62 are ion implanted into the P-type silicon substrate 50 through the gate oxide layer 54 and are self-aligned by means of the masking effect of the gate 56 and phosphosilicate glass layer 58. The ion implantation species is arsenic which is implanted to a high dosage in a manner well known in the prior art to provide an N+ conductivity for the N channel source and drains of the lower FET device 4. Arsenic is selected as the dopant species for its relatively low thermal diffusivity so that subsequent heat treatment steps on the assembly will not substantially rediffuse the dopant.

Figure 9:
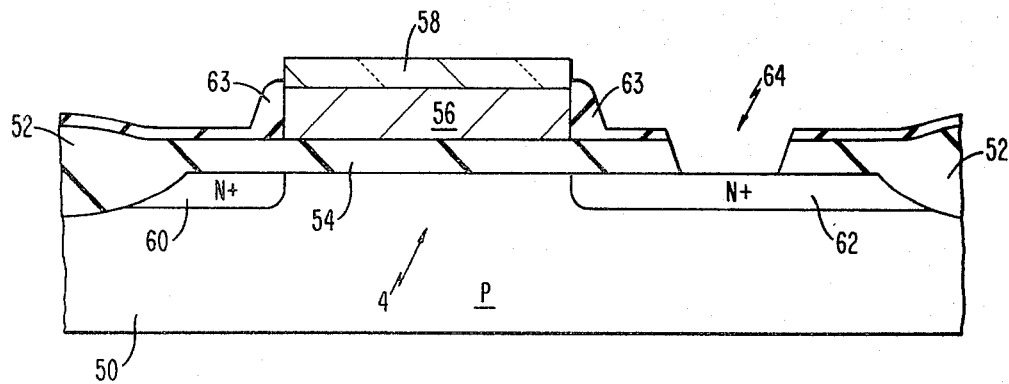

The next significant step is illustrated in FIG. 9 wherein an edge oxide 63 is formed on the polycrystalline silicon surface of gate 56 through low temperature steam oxidation or other techniques to a thickness of 20-300 nanometers in order to completely encapsulate the gate electrode 56. This is followed by etching the contact hole 64 through the total oxide layer above the N+ diffusion exposing a portion of the N+ drain 62.

Figure 10:
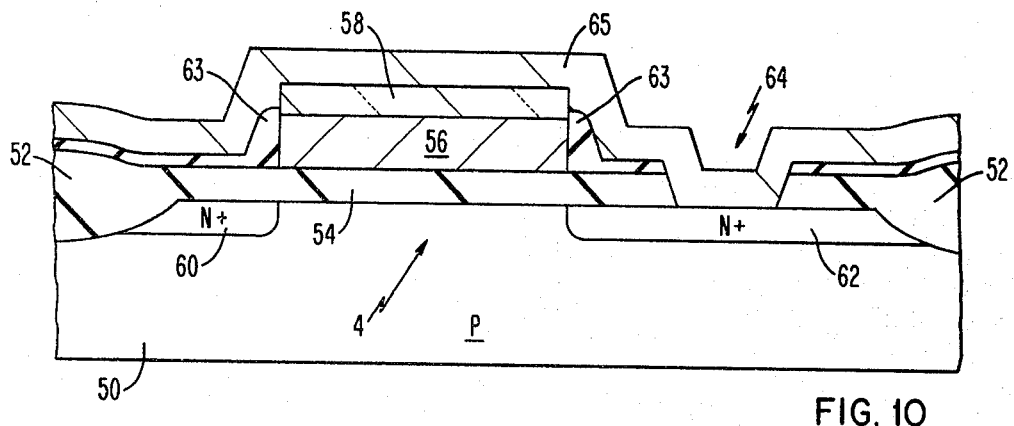

The next significant step is illustrated in FIG. 10 wherein a second layer of polycrystalline silicon 65 is deposited by chemical vapor deposition over the phosphosilicate glass layer 58 above the gate 56 and into the contact hole 64, as shown. The second polycrystalline silicon layer 65 is in situ doped P-type to a concentration of $10^{17}$–$10^{18}$ atoms/cm$^3$ and is deposited to a thickness of from 400 to 1000 nanometers. The layer 65 will ultimately form a portion of the source, channel and drain for the upper, P channel FET device which will share the common gate 56 with the lower N channel FET device 4.

Figure 11:
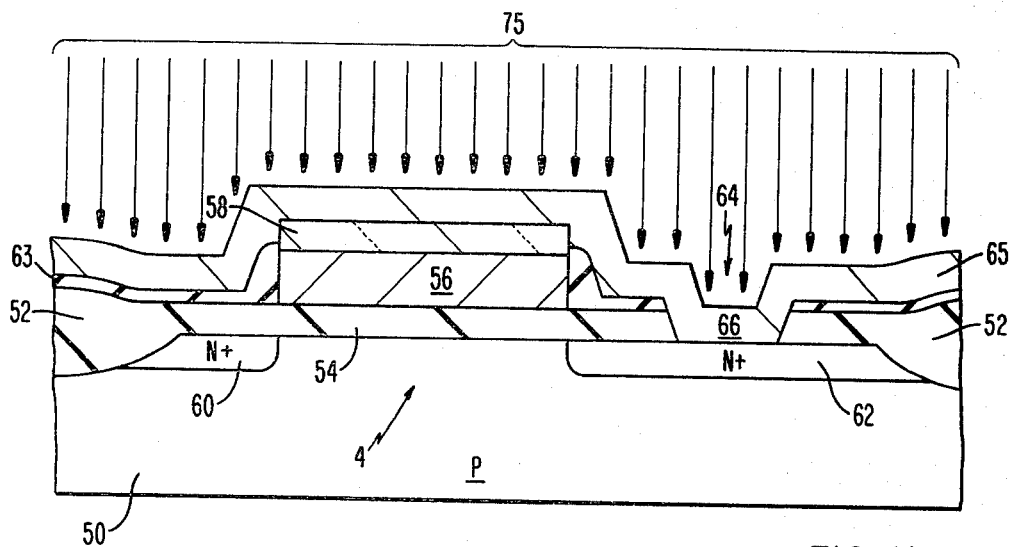
Figure 12:
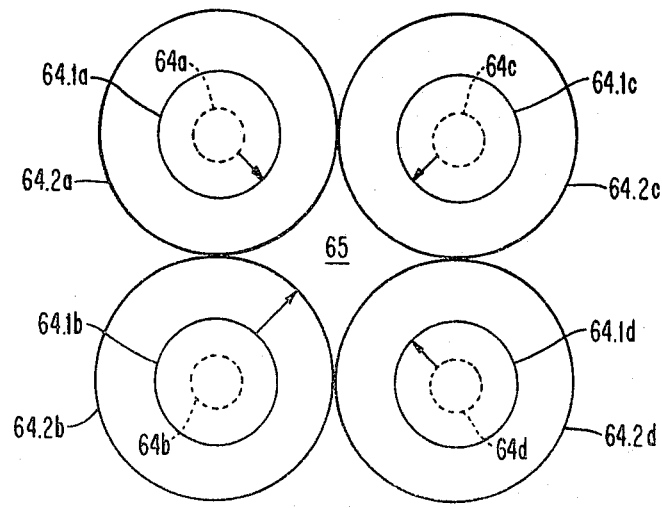

The next significant step is illustrated in FIGS. 11 and 12 wherein a laser beam 75 is rendered incident upon the polycrystalline silicon layer 65, including the region 66 of the layer 65 in the contact hole 64, immediately above the drain region 62, as shown. The heat produced in the region 66 of the layer 65 by the laser beam 75 momentarily melts the polycrystalline silicon material. If a pulsed laser is used, approximately 10 joules per square centimeter of energy pulsed from a Nd: YAG laser for a pulse duration of approximately 125 nanoseconds. If a continuous wave laser is used, an approximately 15 watt continuous argon laser can be employed with a scan rate of approximately 10 centimeters per second. As is shown in FIG. 11, the polycrystalline silicon layer 65 lies in a continuous film on the surface of the structure and the laser beam 75 exposes the entire surface of the polycrystalline silicon layer 65. The heat generated from the laser beam melts the polycrystalline silicon material and an epitaxial recrystallization with a crystalline orientation of the substrate's lattice starts in the portion 66 of the layer 65 which contacts the substrate 50 through the hole 64. As is seen in FIG. 12, there is a progressive lateral growth of the monocrystalline state for the material of layer 65 as the layer is continuously exposed to the heat from the laser beam. As may be seen in FIG. 12, the hole 64 is shown for four adjacent devices as the holes 64a, 64b, 64c and 64d. These holes are shown hidden behind the polycrystalline layer 65. After a first duration of exposure to the laser beam energy, the region of monocrystalline reorientation of the layer 65 is encompassed by the particular boundaries 64.1a which surrounds 64a, 64.1b which surrounds 64b, 64.1c, which surrounds 64c and 64.1d which surrounds 64d. After a still longer duration of exposure of the layer 65 to the energy from the laser beam, a still larger region of monocrystalline reorientation of the layer 65 is encompassed by the respective circular areas 64.2a, 64.2b, 64.2c and 64.2d. Eventually, the regions of monocrystalline reorientation in the originally polycrystalline silicon layer will have grown out from the original hole 64 to completely overlap and form a continuous monocrystalline silicon layer 65 having a lattice orientation epitaxially formed as the same orientation of the monocrystalline silicon substrate 50.

This technique is not unlike the seed crystal, lattice reorientation principle associated with zone melting and refinement of larger silicon boules, well known in the art. The object of laser annealing is to reorient the entire layer 65 from a polycrystalline phase to a monocrystalline phase in order to provide a high mobility medium for the formation of the upper, P channel FET device. Laser induced epitaxy of amorphous silicon layers has been described in the literature, for example J. C. Bean, et al., "Substrate and Doping Effects Upon Laser Induced Epitaxy of Amorphous Silicon," *Journal of Applied Physics*, 50(2), Feb. 1979, pages 881-885. This publication describes a laser heating technique for converting an amorphous silicon film material into a monocrystalline material by epitaxial reorientation from a monocrystalline surface as a seed material.

Figure 18A:
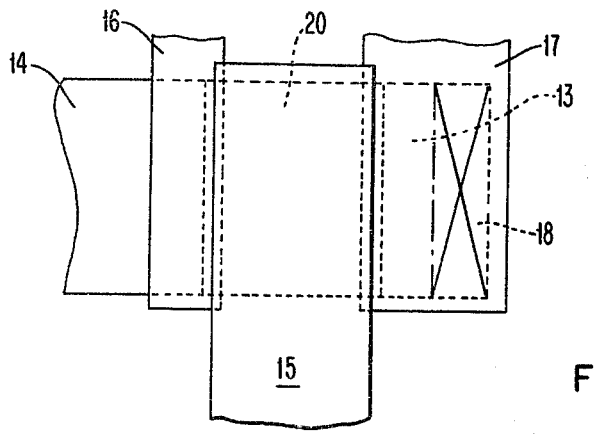
FIG. 18A is a plan view of the stacked CMOS device for FIG. 3A.
Figure 18B:
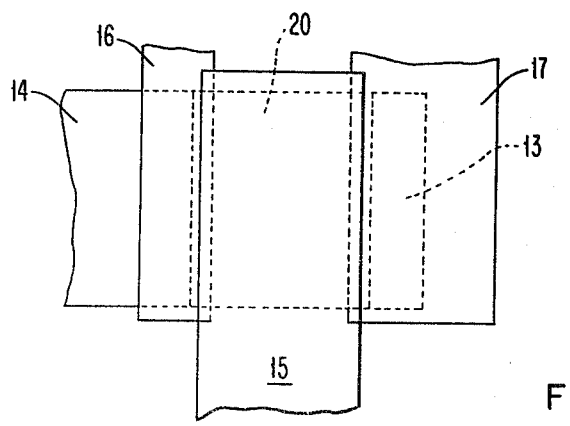
FIG. 18B is a plan view of the stacked CMOS device for FIG. 3B.

The continuous polycrystalline silicon layer, which has now been laser recrystallized, is etched to form the delineated segment 13 in FIGS. 18A and 18B covering the source 60, gate 56, and drain 62 of the lower FET device 4 shown in FIG. 10.

Figure 13:
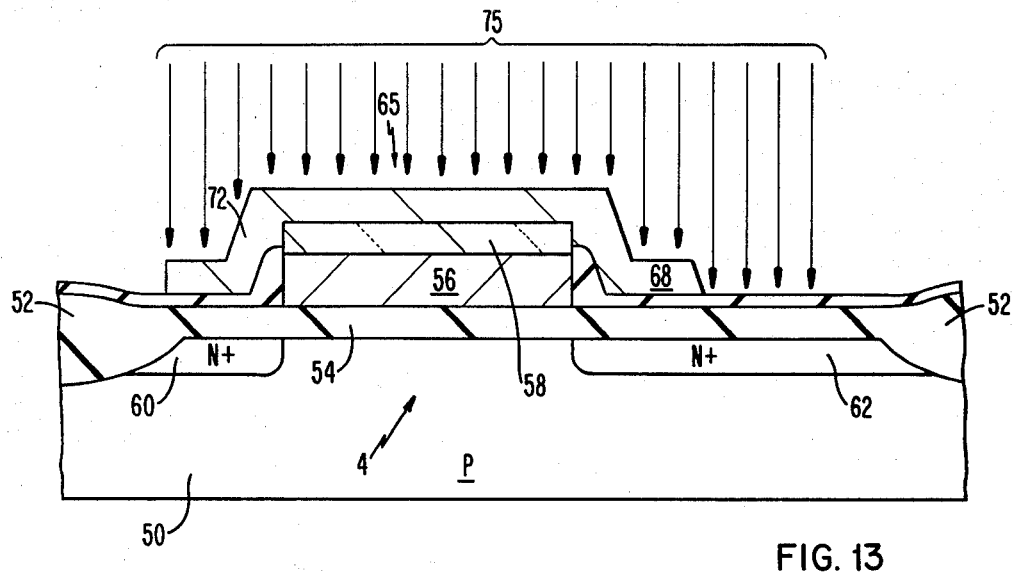

In an alternate embodiment of the invention, the scanned laser beam 75' shown in FIG. 13 can initially expose an arbitrary portion of the etched polycrystalline silicon layer 65 to enlarge the grain of silicon exposed at the point of incidence, thus reversing the sequence of laser annealing and etching discussed in the first embodiment. It has been reported in A. Gat, et al. "CW Laser Anneal of Polycrystalline Silicon: Crystalline Structure, Electrical Properties," *Applied Physics Letters*, 33(8), Oct. 1978, that the granular size of polycrystalline silicon can be significantly enlarged by laser annealing without the need for an initial seed from a large monocrystalline silicon surface. The resultant orientation of the recrystallized silicon material will be arbitrary and have the orientation of the original monocrystalline grain.

Figure 14:
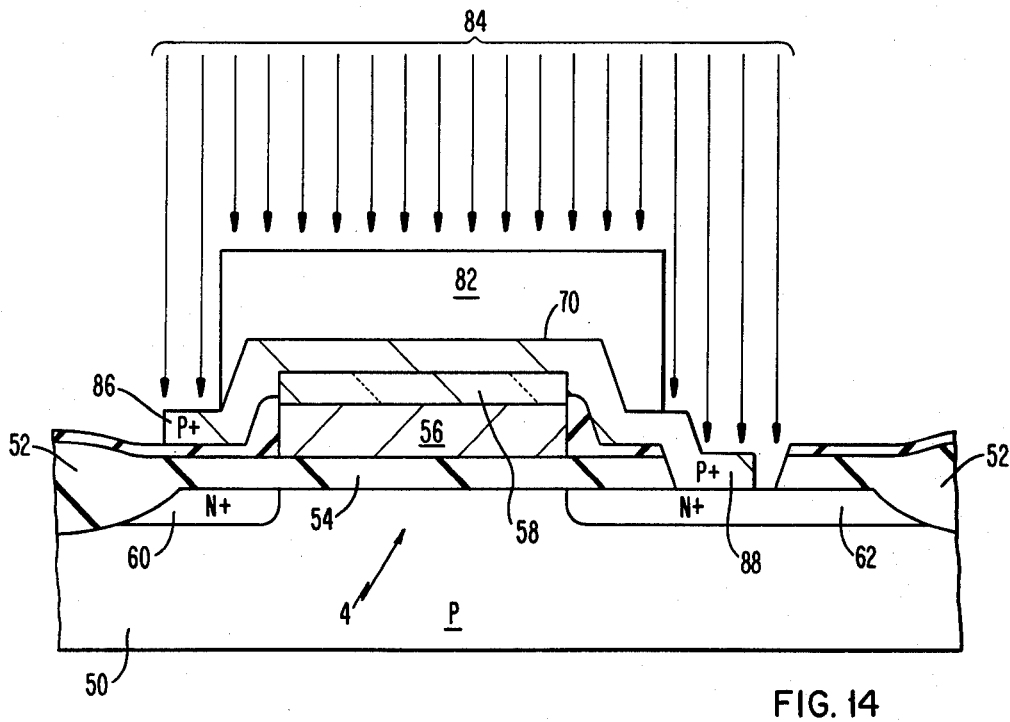

As an option, if a high conductivity P+ region is desired, the P-type ion implantation 84 in FIG. 14 is to be carried out to define the high concentration P-type source and drain regions 86 and 88, respectively of the upper, P channel FET device 6. In order to perform this ion implantation exclusively for the source and drain regions 86 and 88 of the P channel FET device, a block out mask 82 is placed over the central region of the assembly including the gate 56 in order to avoid inadvertently ion implanting a P-type conductivity in the central regions. A block out mask can be made of for example a photoresist material which is thick enough to stop the boron ions from penetrating into the structures at 70 already formed.

Figure 15:
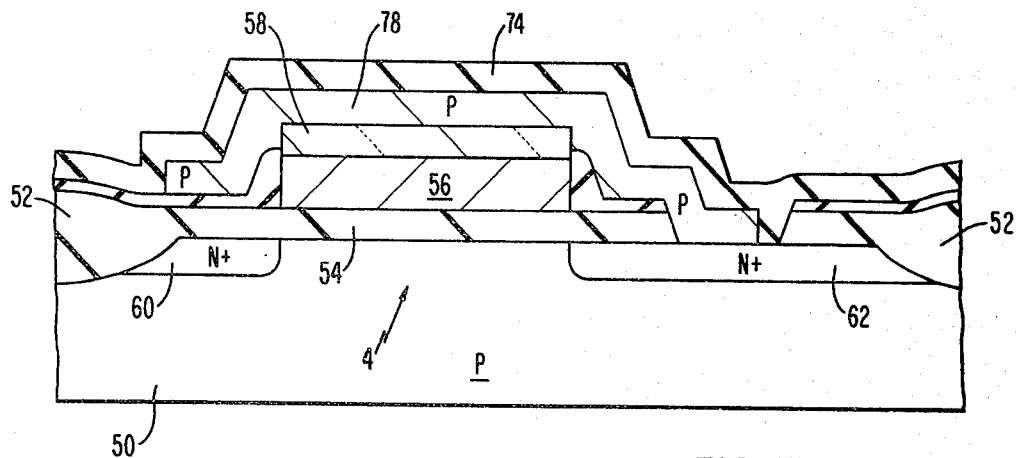

The next significant step following a laser recrystallization step, is shown in FIG. 15 wherein a silicon dioxide layer 74 is deposited by chemical vapor deposition to a thickness of approximately 300 nanometers.

Figure 16:
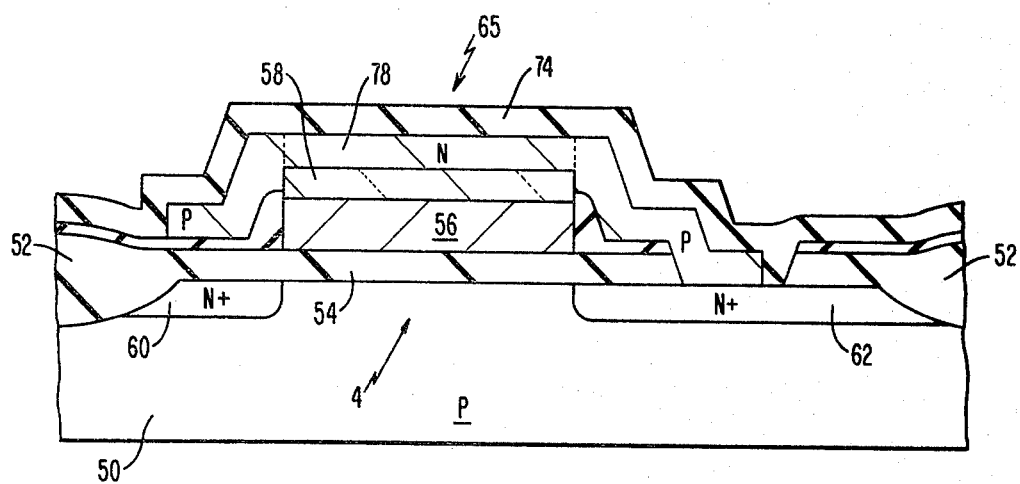

The next significant step is illustrated in FIG. 16 wherein the assembly is heat treated to perform a solid state diffusion of phosphorus from the phosphosilicate glass (PSG) material in the layer 58 into the monocrystalline silicon layer 65, as is shown in the figure. During the heating step, phosphorus atoms are diffused out of the phosphosilicate glass layer 58 in an upward direction and dope the silicon layer 65 to an N-type conductivity in the region 78 of the layer 65, as is shown. In FIG. 15, the region 78 will form the active channel region of the upper, P channel FET device 6. It is to be noted that the phosphosilicate glass layer 58 was etched and delineated at the same time as was the polycrystalline silicon gate region 56, and thus the region 78 of N-type conductivity, produced by the solid state diffusion of the phosphorus atoms from the PSG layer 58, will be self-aligned with the polycrystalline silicon gate 56. In this manner, the channel of the upper, P channel FET device 6 will be self-aligned with the gate 56 which is shared in common with the self-aligned N channel FET device 4.

The resultant P channel FET device has less overlap capacitance of the gate to the drain, better control of the width to length ratio for higher power and performance distribution, a smaller area required for the layout of the device, and it may have direct contact between the N+ diffusion and the P-type laser annealed silicon.

The relative thicknesses of the PSG layer 58 and the silicon layer 65, the phosphorus doping concentration of the PSG layer 58 and the energy density and exposure duration of the laser beam 75 in the step of FIG. 11 can be adjusted so that the solid state diffusion of phosphorus atoms from the PSG layer 58 into the silicon layer 65 may be completed during the step of recrystallization of the polycrystalline phase of silicon layer 65 into its monocrystalline phase.

Figure 17:
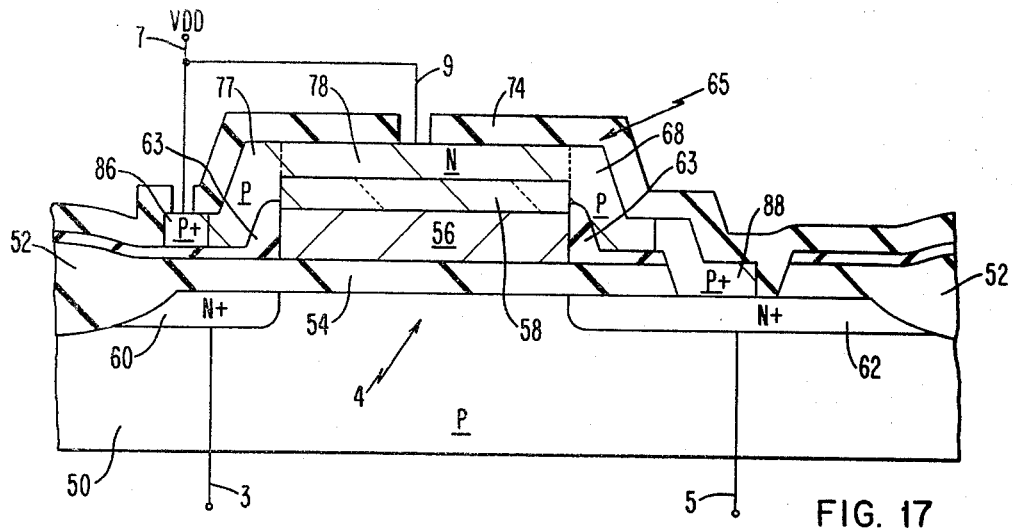

The next step in FIG. 17 is carried out to etch contact holes through CVD oxide layer 74 so as to enable the electrical contact of the source 86 and the "substrate" 78 of the P channel FET device. Any other suitable contacts which are to be made can be formed at this time. An aluminum wiring pattern is then deposited to interconnect the device shown in FIG. 17 with other devices in a large scale integrated circuit chip. The P+ source 86 and P+ drain 88 are optional as discussed previously.

FIGS. 18a and 18b illustrate top views of the resulting stacked CMOS device shown in FIGS. 3a and 3b, respectively, more plainly illustrating the delineation of the upper silicon layer 65. FIGS. 3A, 3B, 18A, 18B and FIGS. 4 through 17 can be equated as follows. In FIG. 3A, diffusions 16 and 17 correspond to diffusions 60 and 62 in FIG. 17. In FIG. 3A, the thin oxide layer 22 corresponds to the thin oxide layer 54 in FIG. 17. In FIG. 3A, the upper insulating oxide 24 corresponds to the oxide regions 58 and 63 of FIG. 9. The gate electrode 15 of FIG. 3A corresponds to the gate electrode 56 of FIG. 17. The layer of laser annealed silicon 25 in FIG. 3A corresponds to the layer of laser annealed silicon 65 of FIG. 17. New portions 14, 20, 13 and 18 of the laser annealed silicon layer 25 of FIG. 3A correspond to the portions 86, 77, 78, 68 and 88 of the layer 65 of laser annealed silicon in FIG. 17.

The stacked CMOS device can be considered as a five terminal device 90 which is shown in electrical schematic diagram form in FIG. 19 wherein the contacts to the source 60 and drain 62 contacts for the N channel FET device 4, the contacts to the source 86 and drain 88 regions for the P channel FET device 6 and the gate electrode 15 for the two FET devices can be considered the five terminals of device 90.

Figure 1:
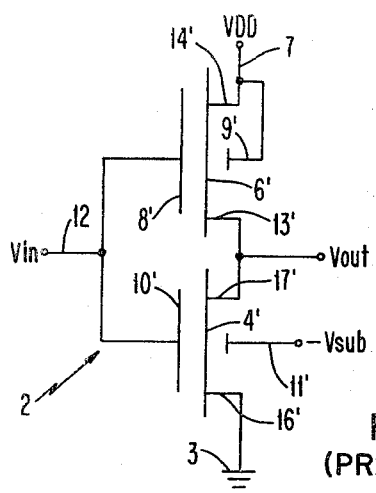
FIG. 1 is a schematic electric diagram of a conventional CMOS inverter.
Figure 20:
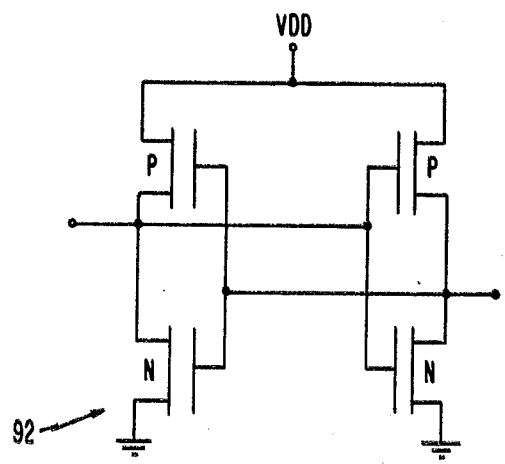
FIG. 20 is an electrical schematic of a conventional CMOS flip-flop.
Figure 21:
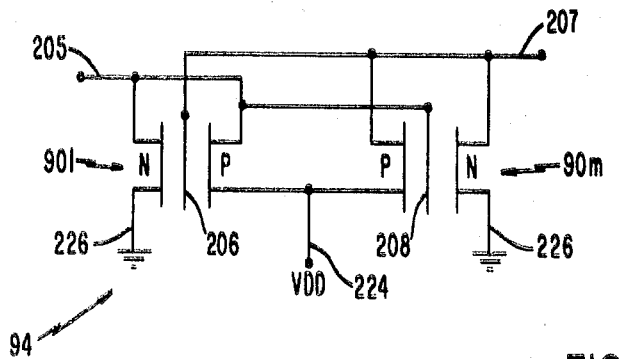
FIG. 21 is an electrical schematic of a flip-flop circuit embodied in the stacked CMOS devices.

This five terminal device concept enables the layout of conventional CMOS circuits in a more highly compact form than has been available in the prior art. For example, in FIG. 20, a conventional CMOS circuit topology 92 is shown for a flip-flop function, consisting of a pair of cross-coupled CMOS inverters 2 as shown in FIG. 1. FIG. 21 illustrates the circuit implementation 94 of the flip-flop function employing the stacked CMOS device invention, using two of the five terminal devices 90 shown in FIG. 19 designated as devices 90*l* and 90*m* in FIG. 21. The gate 206 of device 90*l* is connected to the terminal 207. The N channel portion of device 90*m* is connected between terminal 207 and ground terminal 226. The P channel portion of device 90*m* is connected between terminal 207 and the VDD terminal 224. The gate 208 of device 90*m* is connected to the terminal 205. The N channel portion of device 90*l* is connected between terminal 205 and ground terminal 226. The P channel portion of device 90*l* is connected between terminal 205 and the VDD terminal 224. In this manner, devices 90*l* and 90*m* are cross-coupled to form a flip-flop. It is to be noted that the cross-sectional area occupied by the resulting circuit 94 is less than half that which would be occupied in the conventional CMOS embodiment 92.

Figure 22:
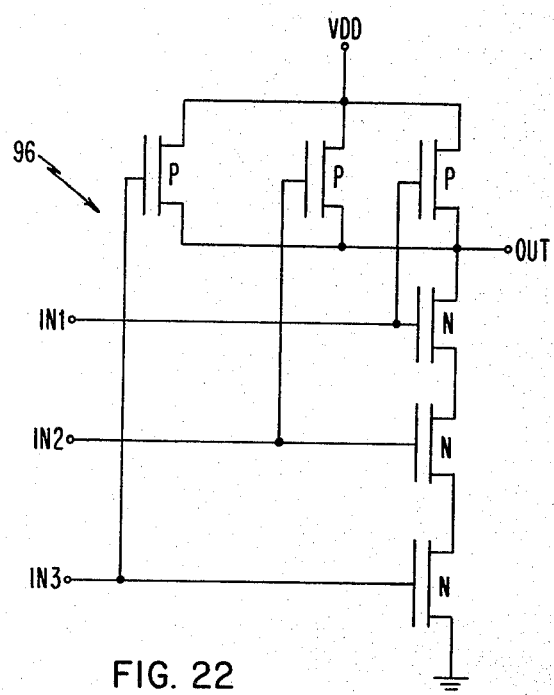
FIG. 22 is an electrical schematic of a conventional three input NAND logic function embodied in conventional CMOS devices.
Figure 23:
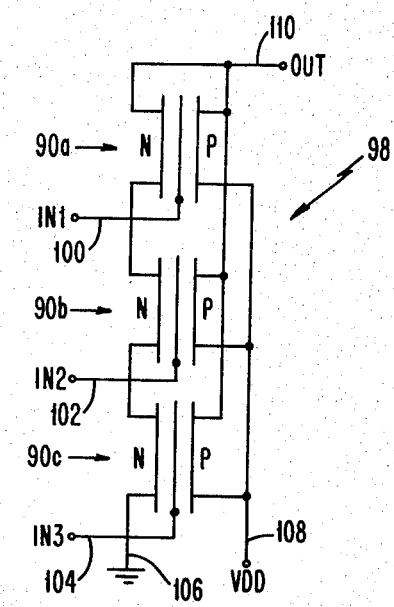
FIG. 23 is a three input NAND logic function embodied in stacked CMOS devices.
Figure 24:
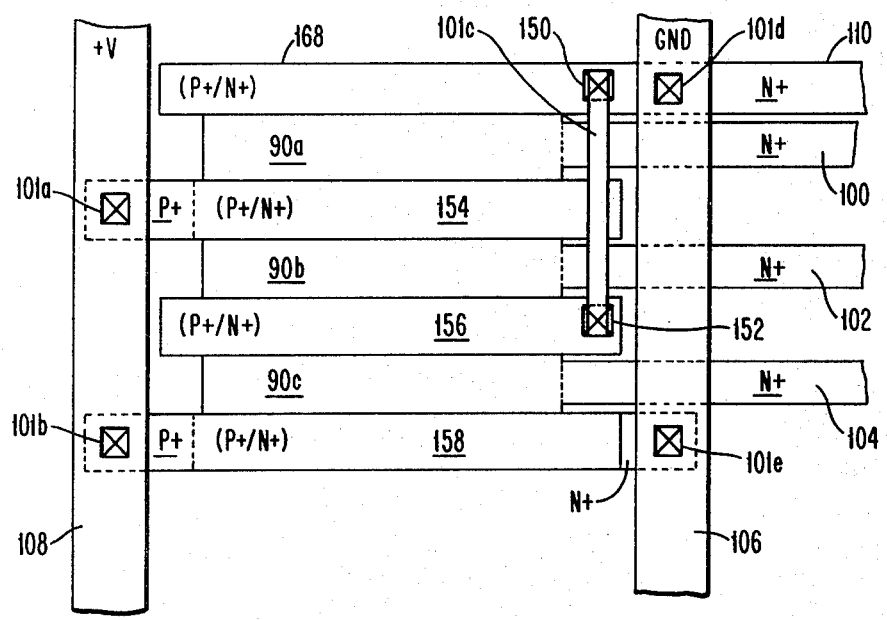
FIG. 24 is a physical layout of the circuit of FIG. 23.

Still other illustrations of the amenability of the stacked CMOS device 90 to compact layout of conventional logic functions is shown in FIGS. 22 through 30. FIG. 22 illustrates a circuit schematic diagram of a conventional, six device CMOS circuit 96 for a three input NAND logic function and FIG. 23 illustrates the circuit 98 for the same logical function as it would be embodied in a stacked CMOS device invention, using three of the five terminal devices 90 of FIG. 19. FIG. 24 shows the top view of an integrated circuit layout for the circuit shown in FIG. 23. Devices 90*a*, 90*b* and 90*c* have input gates 100, 102 and 104, respectively. The common source 154 of P channel devices 90*a*P and 90*b*P is connected to the positive potential 108 through the P+ to A1 contact 101*a*. The source 158 of P channel device 90*c*P is connected to line 108 through the contact 101*b*. Drains 168 and 156 of the P channel devices 90*b*P, 90*c*P and 90*a*P are shorted together at the metal level 101*c*. The common drain of the P channel devices is shorted to the drain of the N channel device 90*a*N through the P+ to N+ contact 101*d*. Ground potential 106 is connected only to the source 158 of N channel device 90*c*N through the N+ to metal contact 101*e*. Power buses common to many circuits are at the metal level. It can be seen that the three input NAND logic functions can be embodied as the circuit 98 in a very small space on a large scale integrated circuit chip.

Figure 31:
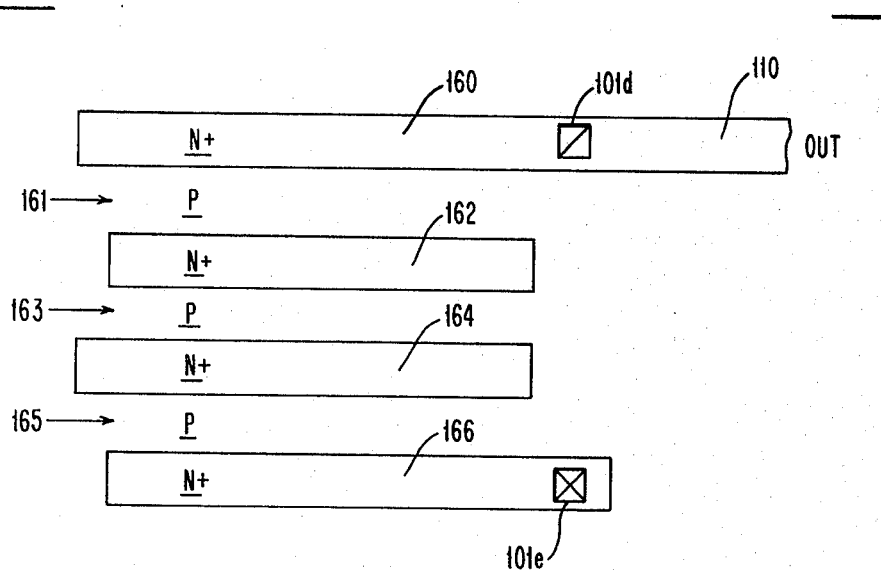
FIG. 31 is the lowest layer in the composite physical layout of the NAND circuit in FIG. 24, showing the N+ diffusions in the substrate.
Figure 32:
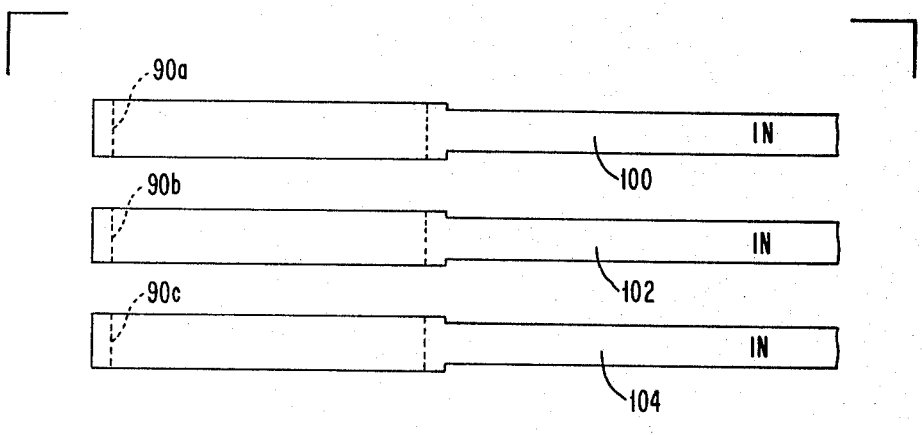
FIG. 32 is the second layer in the composite physical layout of the NAND circuit in FIG. 24, showing the thin gate oxide and polycrystalline silicon gate shapes.
Figure 34:
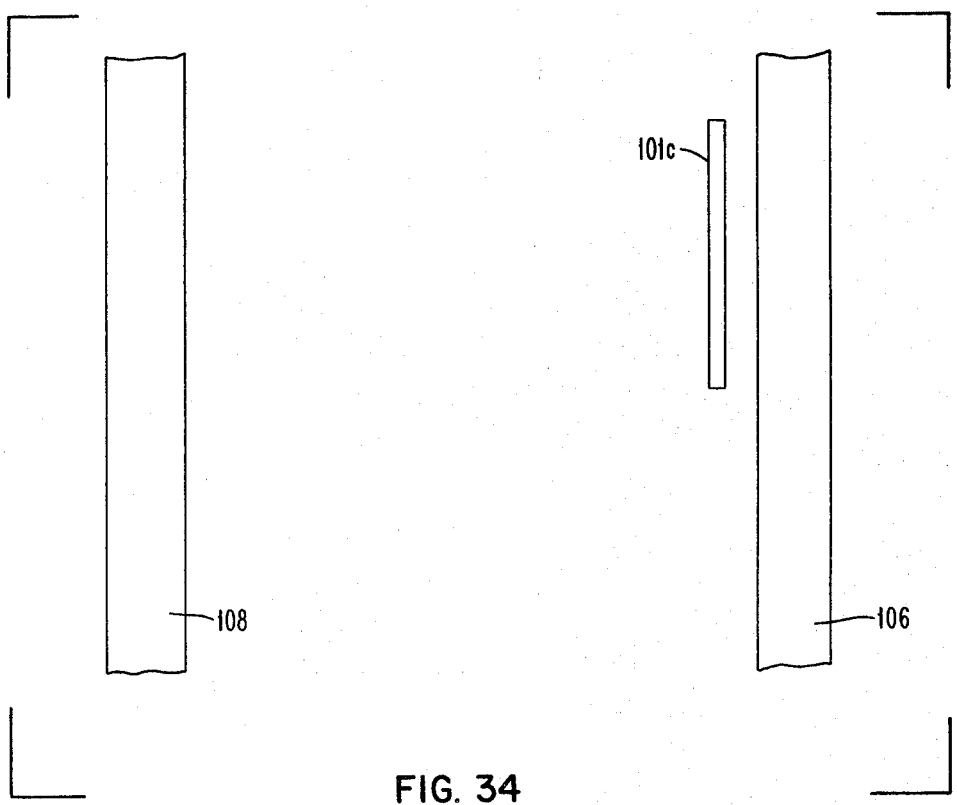
FIG. 34 is the fourth and topmost layer of the composite physical layout of the NAND circuit of FIG. 24, showing the metal interconnection lines.

The stacked CMOS, three-input NAND integrated circuit layout shown in FIG. 24 is decomposed into four levels, the first or lowest layer shown in FIG. 31 is of the N+ diffusions in the substrate, the second layer shown in FIG. 32 is of the gate thin oxide and polycrystalline silicon gate shapes, the third of FIG. 3 illustrates the P+ regions in the laser annealed silicon layer, and the fourth or topmost layer of FIG. 34 illustrates the metal interconnection lines.

A first diffusion bar 160 of FIG. 31 which corresponds to the diffusion 17 in FIG. 3B, is of N-type conductivity in the P-type silicon substrate which corresponds to 19 of FIG. 3B. A second diffusion bar 162 of FIG. 31 which corresponds to the diffusion 16 of FIG. 3B, is of N-type conductivity in the substrate and is located in spaced, parallel relationship with the first bar 160 so that it forms a first N channel region 161 therebetween, which corresponds with region 27 shown in FIG. 3b.

A third diffusion bar 164 of FIG. 31 is of N-type conductivity in the substrate and is located in spaced, parallel relationship with the second bar 162, forming a second N channel region 163 therebetween. A fourth diffusion bar 166 in FIG. 31 is of N-type conductivity in the substrate and is located in spaced, parallel relationship with the third bar 164, forming a third N channel region 165 therebetween. Contact 101e connects diffusion bar 166 to the metal ground line 106.

The first N channel region 161 is covered by an insulating layer 22 as is shown in FIG. 3B, which supports a first logical input gate electrode 100 in FIG. 32 which corresponds to the electrode 15 in FIG. 3B, which is juxtaposed with the first N channel region 161, forming a first N channel FET device 90aN, as shown in FIG. 23.

The second N channel region 163 is covered by an insulating layer 22, which supports a second logical input gate electrode 102 shown in FIG. 32, which is juxtaposed with the second N channel region 163, forming a second N channel FET device 90bN as is shown in FIG. 23.

The third N channel region 165 is covered by an insulating layer 22 which supports a third logical gate electrode 104 as shown in FIG. 32, which is juxtaposed with the third N channel region 165, forming a third N channel FET device 90cN.

Figure 33:
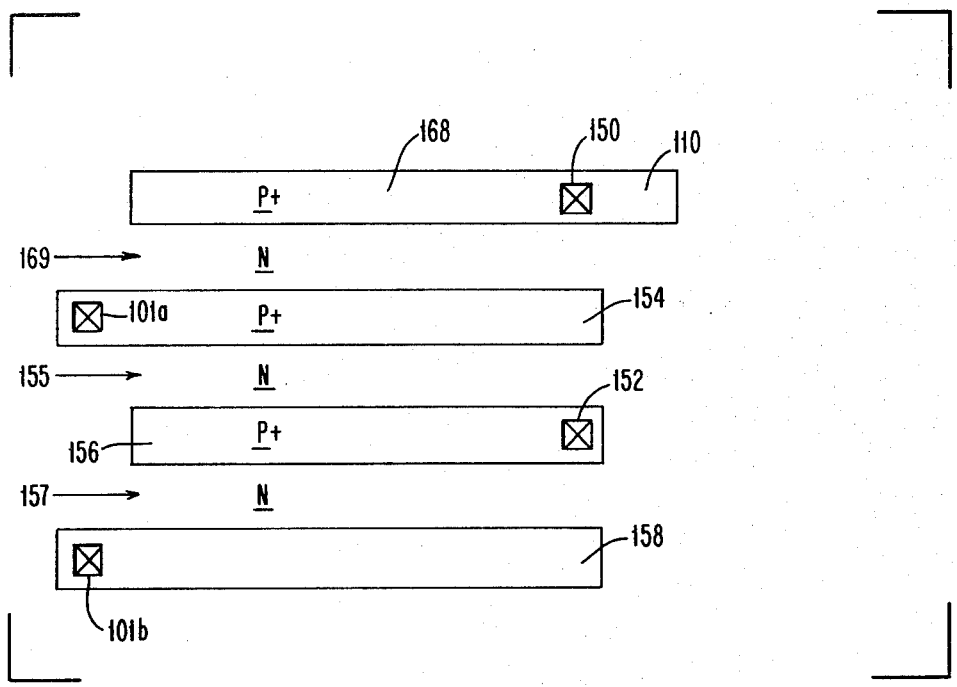
FIG. 33 is the third layer in the composite physical layout of the NAND circuit of FIG. 24, showing the laser annealed silicon layer with its P+ regions.

A layer of laser annealed silicon 25 of FIG. 3B has a first N-type portion 169 of FIG. 33 or portion 20 covers a juxtaposed portion of the first gate electrode 100, and which further has a first P-type portion 168 in FIG. 33 which corresponds to the portion 13 in FIG. 3B, which is juxtaposed over the first diffusion bar 160, and the layer further has a second P-type portion 154 shown in FIG. 33 corresponding to the portion 14 in FIG. 3B, which is juxtaposed over the second diffusion bar 162, thereby forming a first P channel FET device 90aP as is shown in FIG. 23. Contact 150 connects the P-type portion 168 to the metal line 101c. Contact 152 connects the metal line 101c to the P-type portion 156. FIG. 34 shows the metal line 101c, the +V metal line 108 and the ground metal line 106.

The layer of laser annealed silicon 25 has a second N-type portion 155 covering the juxtaposed portion of the second gate electrode 102 and the layer has a third P-type portion 156 in FIG. 33 which is juxtaposed over the third diffusion bar 164 forming a second P channel FET device 90bP of FIG. 23, with the second P-type portion 154.

The layer of laser annealed silicon 25 has a third N-type portion 157 covering the juxtaposed portion of the third gate electrode 104 and the layer further has a fourth P-type portion 158 of FIG. 33, which is juxtaposed over the fourth diffusion bar 166, forming a third P channel FET device 90cP with the third P-type portion 156.

The first N+ diffusion bar 160 is connected to the logical output terminal 110 of FIG. 31 labeled OUT. The fourth diffusion bar 166 is connected to the ground metal line 106 in FIG. 34 by means of the via contact 101e. The second diffusion bar 162 operates as the source of the first N channel FET 90aN and the drain of the second N channel FET 90bN. The third diffusion bar 164 operates as the source of the second N channel FET 90bN and as the drain of the third N channel FET 90cN.

The first P+ portion 168 and the third P+ portion 156 of the layer of laser annealed silicon 25 are connected to the logical output terminal 110 and the second P+ portion 154 and the fourth P+ portion 158 are connected to the positive metal line 108 by means of the respective contacts 101a and 101b. The second portion 154 operates as the source for both the first P channel FET 90aP and the second P channel FET 90bP. The third P+ portion 156 operates as the drain for both the second P channel FET 90bP and the third P channel FET 90cP.

The resulting stacked CMOS, three-input NAND integrated circuit occupies less space than does the conventional CMOS NAND circuit shown in FIG. 22. In fact, the area is no larger than that for a conventional NMOS three-input NAND circuit.

It should be noted that the doped, recrystallized silicon layer forming line 168 can also form device interconnection wiring in FIG. 24, thus adding an additional degree of freedom for wirability which features gate cross-overs.

Figure 25:
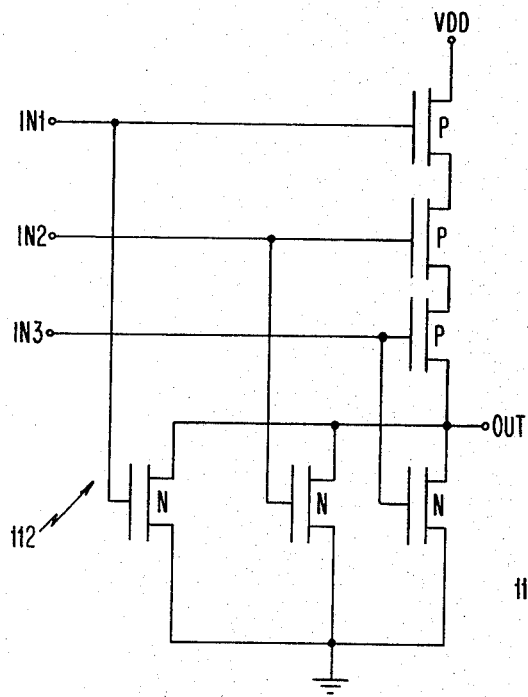
FIG. 25 is an electrical circuit schematic of a conventional NOR logic function embodied in conventional CMOS devices.
Figure 26:
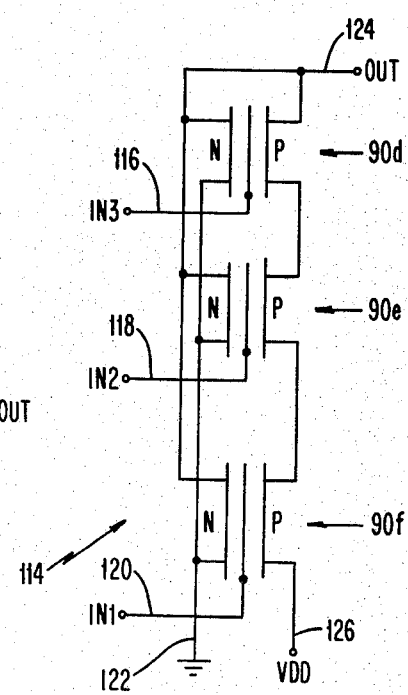
FIG. 26 illustrates a three input NOR embodied in the stacked CMOS device invention.
Figure 27:
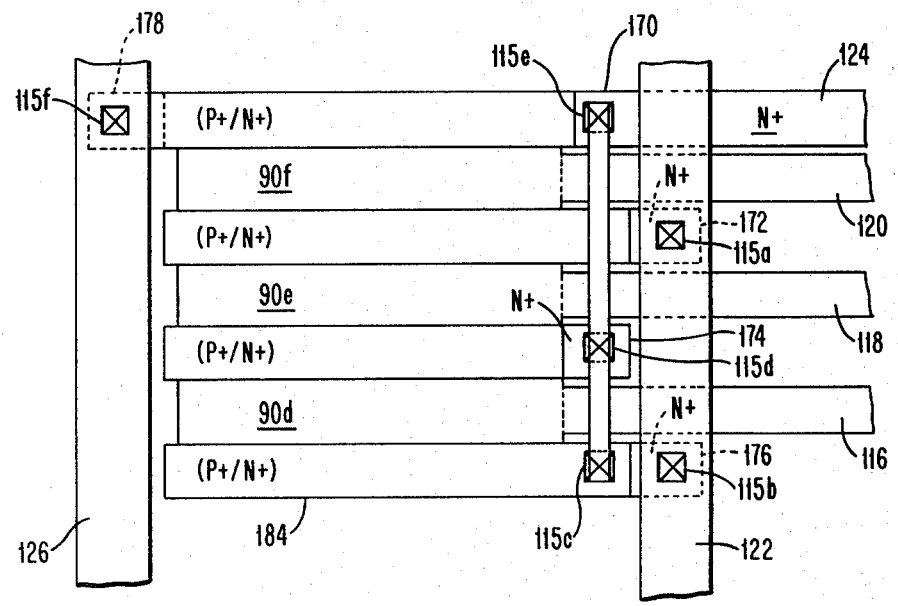
FIG. 27 is a physical layout of the circuit shown in FIG. 26.

FIG. 25 illustrates a conventional CMOS circuit 112 for a NOR logic function embodied in conventional CMOS devices and FIG. 26 illustrates the same NOR function embodied in the circuit 114 using the stacked CMOS devices 90. FIG. 27 illustrates an actual layout of the circuit. Devices 90d, 90e, and 90f have input gates 116, 118 and 120, respectively. Sources 172 and 176 of the N channel devices are connected to ground potential 122 through the N+ to metal contacts 115a and 115b. The drains 170 and 174 of the N channel devices are connected in common to the drain 184 of P channel device 90dP through the P+ to A1 contact 115c, 115d and 115e. The common node, drain 184 of the P channel device 90dP and the drains 170 and 174 of N channel devices 90dN, 90eN, 90fN, become the output 124. The positive potential 126 is connected only to the drain 178 of P channel device 90fP through P+ to metal contact 115f.

Figure 35:
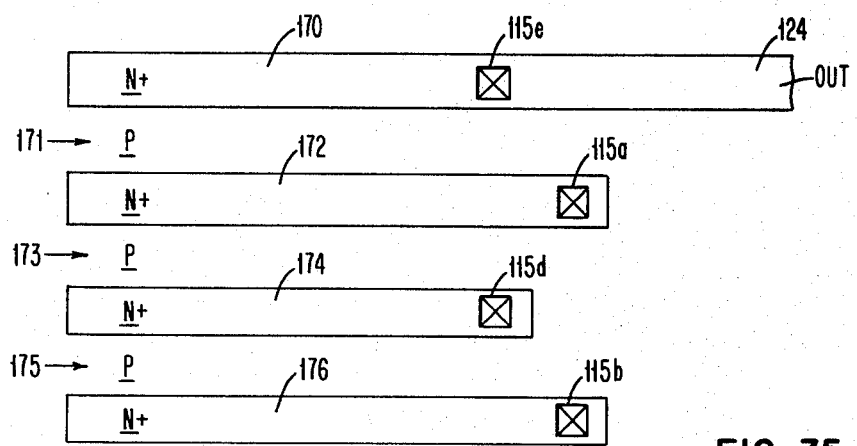
FIG. 35 is the first and lowest layer in the composite physical layout of the NOR circuit of FIG. 27, showing the substrate with its N+ diffusions.
Figure 36:
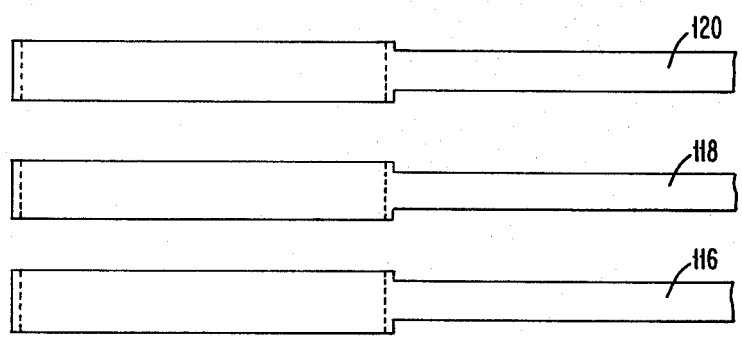
FIG. 36 is the second layer of the composite physical layout for the NOR circuit in FIG. 27, showing the thin gate oxide and polycrystalline silicon gate shapes.
Figure 37:
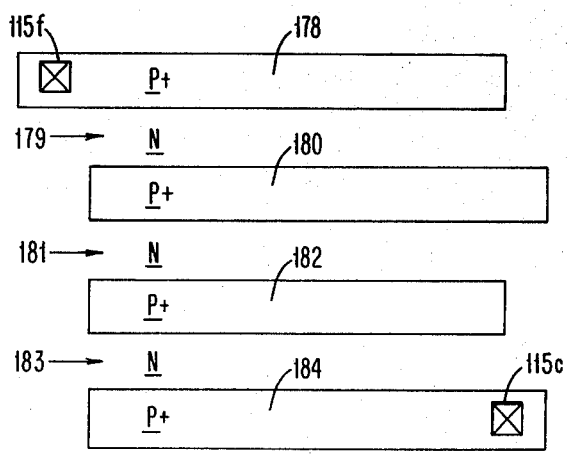
FIG. 37 is the third layer in the composite physical layout of the NOR logic circuit of FIG. 27, showing the laser annealed silicon layer with its P+ regions.
Figure 38:
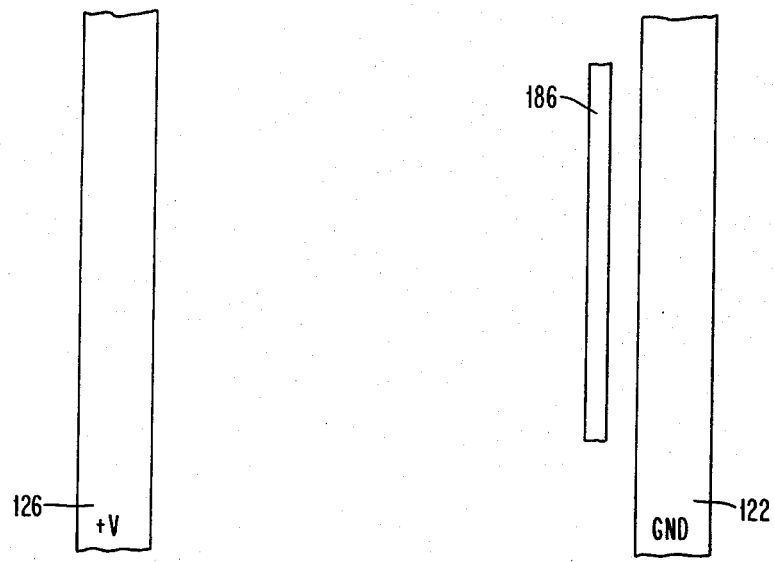
FIG. 38 is the fourth and topmost layer in the composite physical layout of the NOR circuit of FIG. 27, showing the metal interconnection lines.

FIGS. 35 through 38 show four component levels of the composite layout for the NOR circuit shown in FIG. 27. FIG. 35 illustrates the first or lowest layer which are the N+ diffusions in the substrate. FIG. 36 illustrates the second layer which shows the shapes of the thin gate oxide and the polycrystalline silicon gates for the NOR. FIG. 37 shows the third layer which is the laser annealed silicon layer which contains the P+ regions. FIG. 38 illustrates the fourth and topmost layer which contains the metal interconnection lines.

The stacked CMOS, three-input NOR integrated circuit includes the first diffusion bar 170 of FIG. 35 which corresponds to the diffusion 17 of FIG. 3B, of N-type conductivity in the P-type silicon substrate 19 of FIG. 3B. A second diffusion bar 172 of FIG. 35 corresponds to the diffusion 16 of FIG. 3B and is of N-type conductivity in the substrate, and is located in spaced, parallel relationship with the first diffusion bar 170, thereby forming a first N channel region 171 therebetween, which corresponds to the region 27 of FIG. 3B.

A third diffusion bar 174 of FIG. 35 is of N-type conductivity in the substrate and is located in spaced, parallel relationship with the second diffusion bar 172, thereby forming a second N channel region 173 therebetween. A fourth diffusion bar 176 in FIG. 35 is of N-type conductivity in the substrate and is located in spaced, parallel relationship with the third bar 174, thereby forming a third N channel region 175 therebetween.

A first logical input gate electrode 120 of FIG. 36 corresponds to the electrode 15 of FIG. 3B, and is juxtaposed over the first N channel region 171 which is covered by an insulating layer 22 of FIG. 3B, with the first N channel region 171 forming a first N channel FET device 90fN.

A second logical input gate electrode 118 of FIG. 36 is juxtaposed over the second N channel region 173 which is covered by an insulating layer 22, with the second N channel region 173 forming a second N channel FET device 90eN.

A third logical input gate electrode 116 of FIG. 36 is juxtaposed over the third N channel region 175 which is covered by an insulating layer 22, with the third N channel region 175 forming a third N channel FET device 90dN.

A layer of laser annealed silicon 25 of FIG. 3B has a first N-type portion 179 of FIG. 37 which corresponds to portion 20 of FIG. 3B, covering the juxtaposed portion of the first gate electrode 120, and the layer further has a first P-type portion 178 of FIG. 37 which corresponds to the portion 14 of FIG. 3B, juxtaposed over the first diffusion bar 170, and the layer further has a second P-type portion 180 of FIG. 37 which corresponds to the portion 13 of FIG. 3B, which is juxtaposed over the second diffusion bar 172, thereby forming a first P channel FET device 90fP.

The layer of laser annealed silicon 25 has a second N-type portion 181 of FIG. 35 which covers the juxtaposed portion of the second gate electrode 118 and has a third P-type portion 182 which is juxtaposed over the third diffusion bar 174 forming a second P channel FET device 90eP with the second P-type portion 180.

The layer of laser annealed silicon 25 has a third N-type portion 183 of FIG. 37 which covers the juxtaposed portion of the third gate electrode 116 and it has a fourth P-type portion 184 which is juxtaposed over the fourth diffusion bar 176, thereby forming a third P channel FET device 90dP with the third P-type portion 182.

The first diffusion bar 170 is connected to a logical output terminal 124. The fourth diffusion bar 176 is connected by means of contact 115b of FIG. 35 to the ground metal line 122 of FIG. 38. The second diffusion bar 172 is connected to the ground metal line 122, and operates as the source of the first N channel FET device 90fN and as the source of the second N channel FET device 90eN. The third diffusion bar 174 is connected to the output terminal 124 by means of the contact 115d, the metal line 186, and contact 115e and it operates as the drain of the second N channel FET device 90eN and as the drain of the third N channel FET device 90dN.

The fourth P-type portion 184 of the laser annealed silicon layer 25 is connected by means of the contact 115c, the metal line 186, and the contact 115e to the logical output 124. The first P-type portion 178 is connected by means of the contact 115f to the positive potential metal line 126, and operates as the source for the first P channel FET device 90fP. The second P-type portion 180 operates as the drain for the first P channel FET device 90fP and as the source for the second P channel FET device 90eP. The third P-type portion 182 operates as the drain for the second P channel FET device 90eP and the source for the third P channel FET device 90dP. The fourth P-type portion 184 of the silicon layer 25 operates as the drain of the third P channel FET device 90dP.

It can be seen in FIG. 27 that the area occupied by the three input NOR logic function is substantially reduced over that which would be required in the prior art due to isolation needed between N channel and P channel devices.

Figure 28:
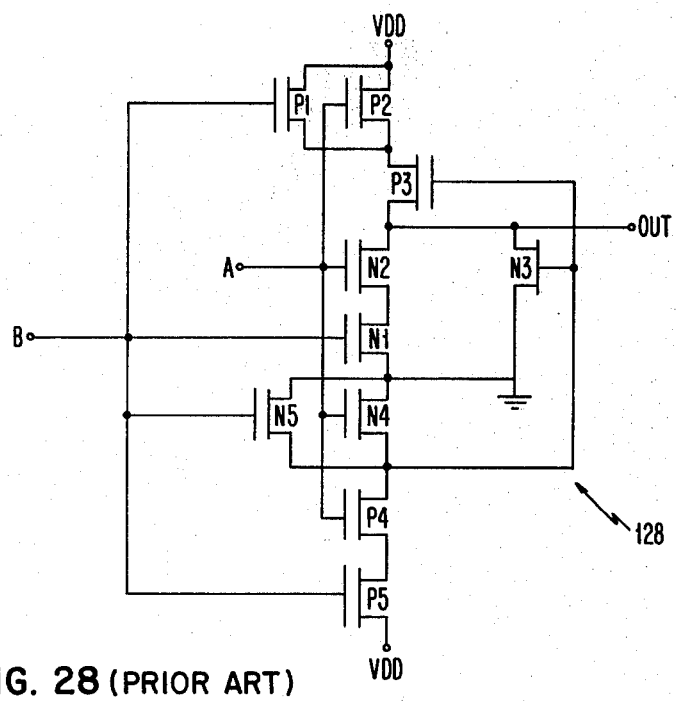
FIG. 28 is an electrical circuit schematic of a conventional exclusive OR logic function embodied in conventional CMOS devices.
Figure 29:
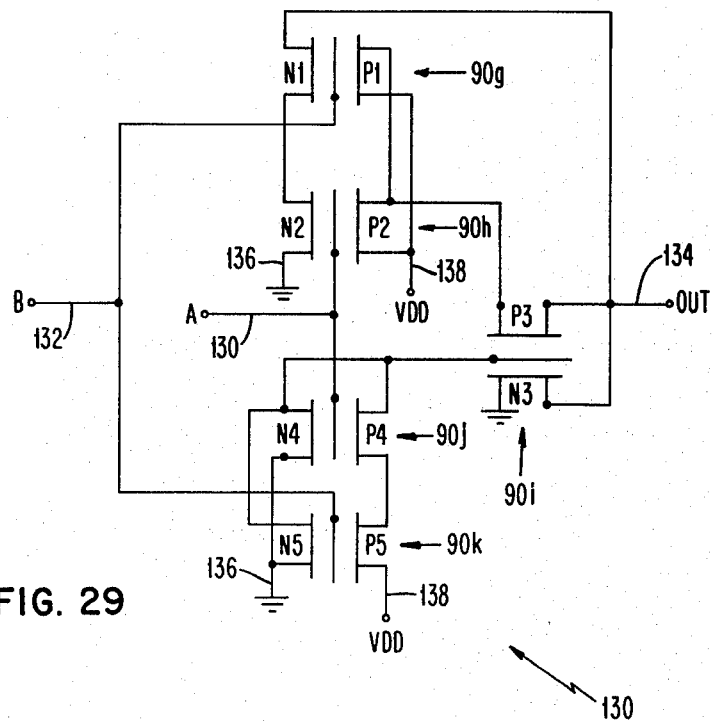
FIG. 29 illustrates an exclusive OR embodied in the stacked CMOS device invention.
Figure 30:
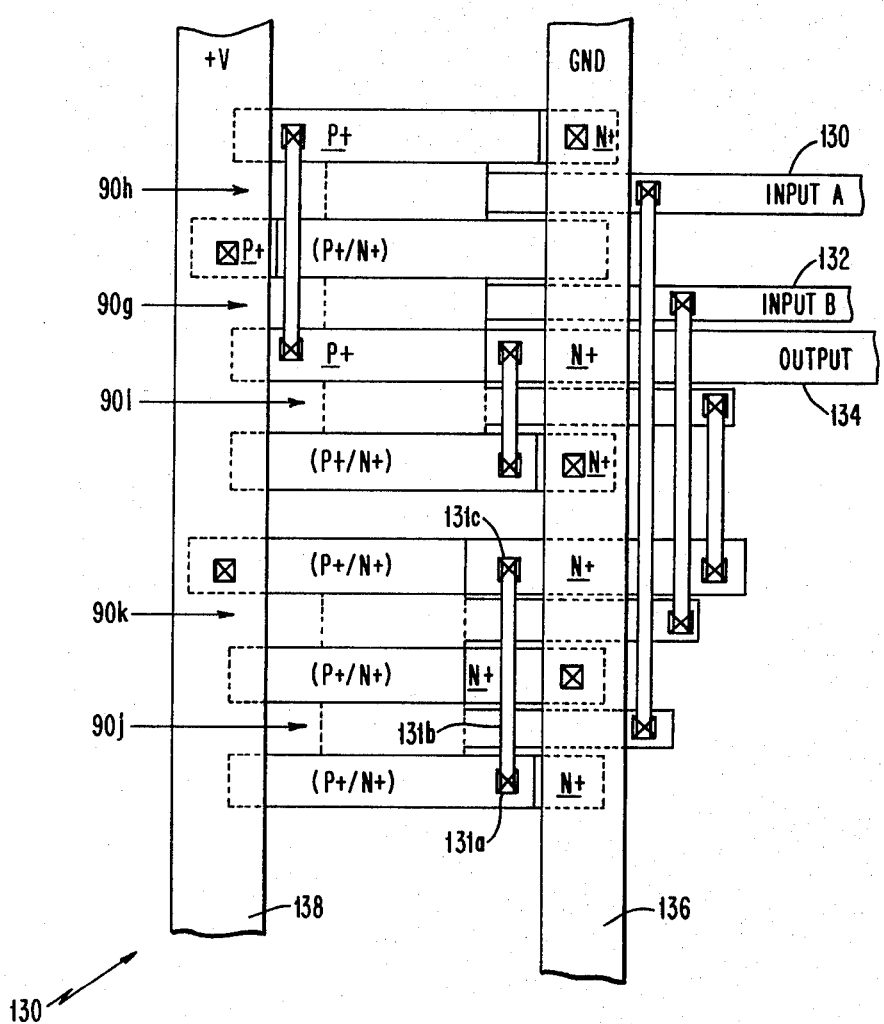
FIG. 30 is a physical layout of the circuit shown in FIG. 29.

FIG. 28 illustrates a conventional electrical circuit schematic diagram for an exclusive OR function embodied in conventional CMOS device circuit 128. FIG. 29 illustrates the same exclusive OR circuit as it would be embodied in the circuit 130 employing the stacked CMOS device 90 designated as devices 90g, 90h, 90i, 90j and 90k in FIG. 29. The A input 130 is connected to the gates of devices 90h and 90j. The B input 132 is connected to the gates of devices 90g and 90k. The VDD terminal 138 is connected through the P channel portion P2 of device 90h and through the P channel portion P3 of the device 90i to the output node 134. The VDD terminal 138 is also connected through the P channel portion P1 of the device 90g and through the P channel portion P3 of the device 90i to the output node 134. The N channel portion N3 of the device 90i is connected between ground potential and the output node 134. The N channel portion N2 of the device 90h is connected between the ground terminal 136 and through the N channel portion N1 of the device 90g to the output node 134. The VDD terminal 138 is connected through the P channel portion P5 of the device 90k and through the P channel portion P4 of the device 90j to the gate of the device 90i. The ground terminal 136 is also connected through the N channel portion N4 of the device 90j to the gate of the device 90i In this manner, an exclusive OR circuit is formed. The devices 90g, 90h, 90i, 90j and 90k are shown in the layout diagram of FIG. 30. FIG. 30 is a top view of the actual layout of the circuit 130 shown in FIG. 29. The P+ or N+ electrode can also be used for device to device interconnections; for example the drains of N channel portion and P channel portion of device 90j are connected together through the P+ to N+ contact 131a. This node is connected to the drain of N channel device 90k via P+ electrode 131b and the P+ to N+ contact 131c. Other device to device interconnections are made using N+ or P+ and/or metal electrodes to complete the exclusive OR function as shown in FIG. 30.

It is seen from the above that substantial improvements can be made in circuit density by employing the disclosed process to implement the disclosed stacked CMOS device for conventional CMOS circuits.

Figure 39:
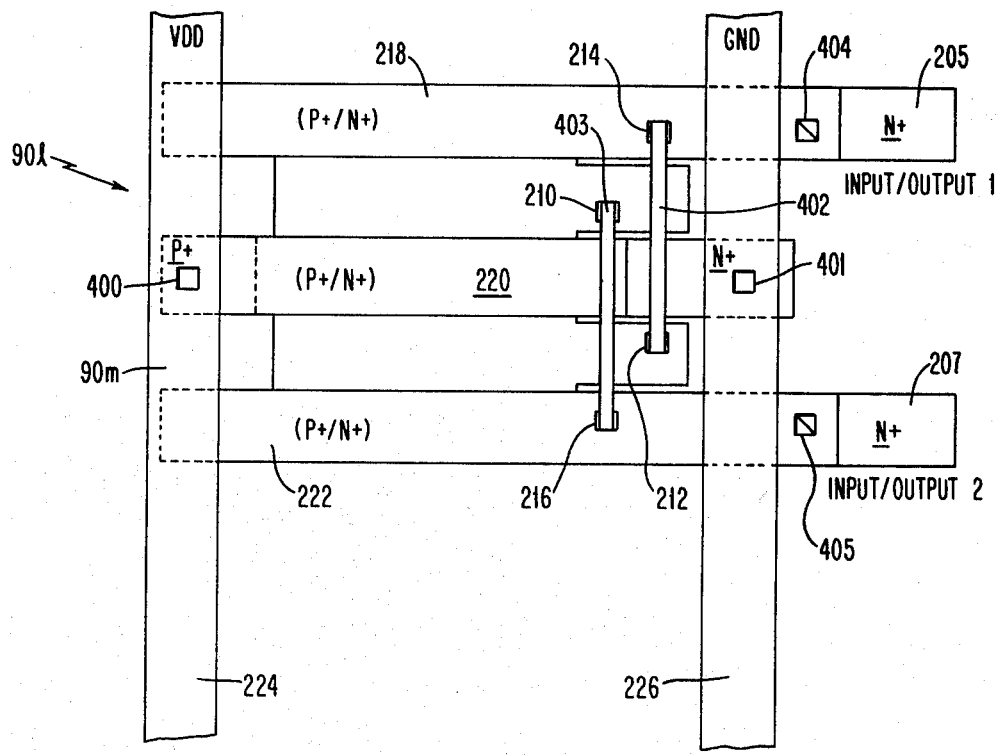
FIG. 39 is a composite layout for the flip-flop of FIG. 21.
Figure 40:
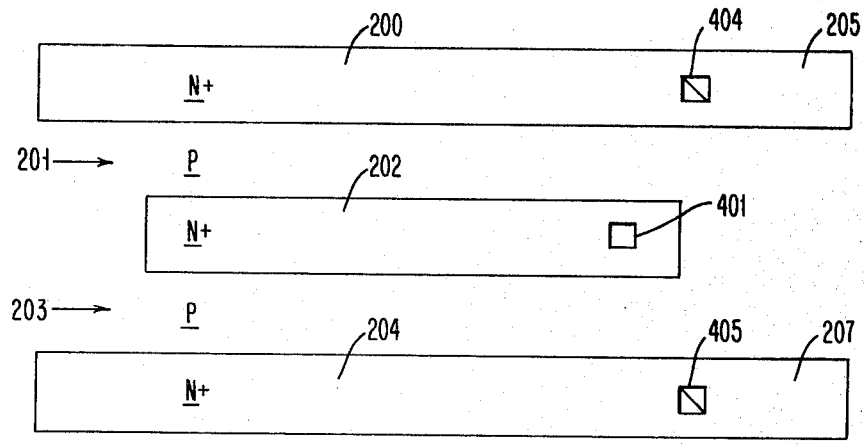
FIG. 40 is the lowest component layer of FIG. 39, illustrating the substrate diffusions.
Figure 41:
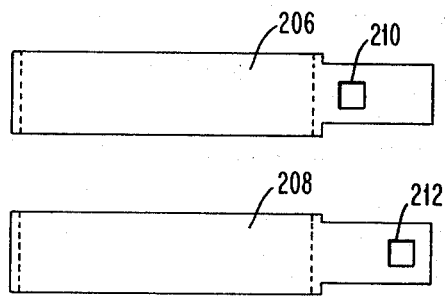
FIG. 41 is the gate oxide and polycrystalline silicon layer for FIG. 39.
Figure 42:
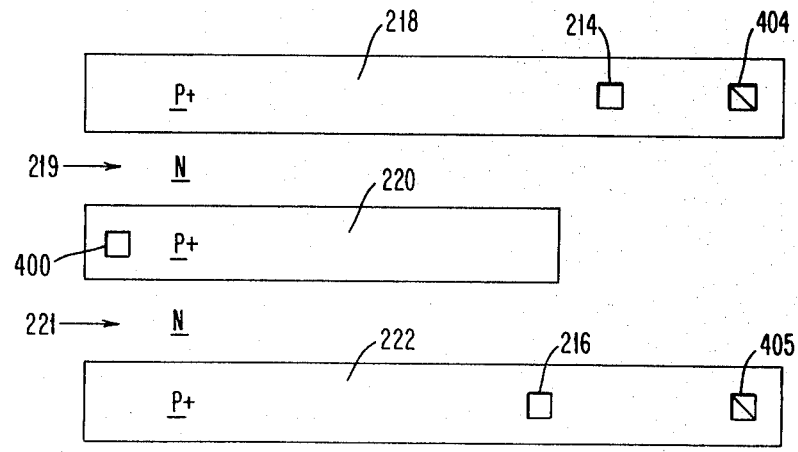
FIG. 42 is the laser annealed silicon layer for FIG. 39.
Figure 43:
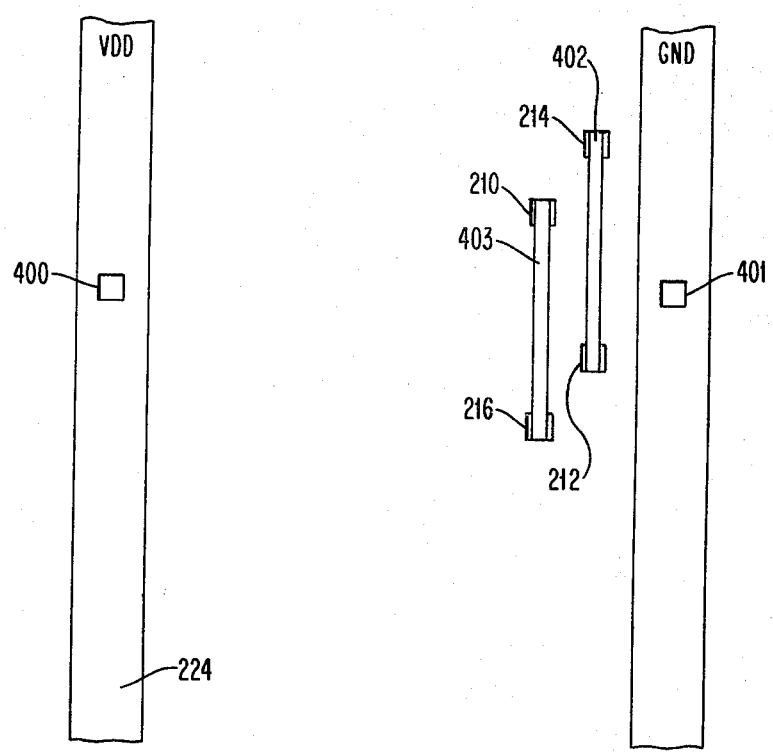
FIG. 43 is the top metal interconnection layer for FIG. 39.

The stacked CMOS flip-flop which is illustrated in the circuit diagram of FIG. 21, is shown in a composite layout in FIG. 39. FIG. 40 illustrates the first lowest layer of the composite of FIG. 39, showing the substrate N+ diffusions for the flip-flop circuit. FIG. 41 shows the second lowest layer in the composite of FIG. 39, showing the gate thin oxide and polycrystalline silicon shapes for the flip-flop circuit. FIG. 42 is the third lowest layer of the composite of FIG. 39, illustrating the laser annealed silicon layer with the P+ regions for the flip-flop circuit. FIG. 43 illustrates the fourth or top component layer of the composite of FIG. 39, showing the metal interconnection lines for the flip-flop circuit.

The stacked CMOS flip-flop integrated circuit includes a first diffusion bar 200 in FIG. 40 which corresponds to the diffusion 16 in FIG. 3B, which is of N-type conductivity in the P-type silicon substrate which corresponds to 19 of FIG. 3B. A second diffusion bar 202 in FIG. 40, which corresponds to diffusion 17 in FIG. 3B, is of N-type conductivity in the substrate and is located in spaced, parallel relationship with the first diffusion bar 200, forming a first N channel region 201 in FIG. 40, therebetween, which corresponds to the N channel region 27 in FIG. 3B. A third diffusion bar 204 in FIG. 40 is of N-type conductivity in the substrate and is located in spaced, parallel relationship with the second diffusion bar 202, forming a second N channel region 203 of FIG. 40, therebetween.

A first logical input gate electrode 206 in FIG. 41, which corresponds to the gate electrode 15 in FIG. 3B, is juxtaposed over the first N channel region 201 which is covered by an insulating layer which corresponds to 22 in FIG. 3B, with the first N channel region 201 forming a first N channel FET device 90*l* of FIG. 39.

A second logical input gate electrode 208 of FIG. 41, is juxtaposed over the second N channel region 203 which is covered by the insulating 22, with the second N channel region 203 forming a second N channel FET portion for device 90*m* of FIG. 39.

A layer of laser annealed silicon such as 25 in FIG. 3B, has a first N-type portion 219 of FIG. 42, which corresponds to the N-type portion 20 of FIG. 3B, which covers the juxtaposed portion of the first gate electrode 206, a first P-type portion 218 of FIG. 42, which corresponds to the P-type portion 14 of FIG. 3B, which is juxtaposed over the first diffusion bar 200, and a second P-type portion 220 of FIG. 42, which corresponds to the P-type portion 13 of FIG. 3B which is juxtaposed over the second diffusion bar 202, forming a first P channel FET portion for device 90*m* of FIG. 39.

The silicon layer 25 has a second N-type portion 221 of FIG. 42, which covers the juxtaposed portion of the second gate electrode 208 and further has a third P-type portion 222 of FIG. 42, which is juxtaposed over the third diffusion bar 204, forming a second P channel FET device 90*m*P with the second P-type portion 220.

The first diffusion bar 200 is connected to a first logical output terminal 205. The second diffusion bar 202 is connected to ground potential 226 by means of the via contact 401. The third diffusion bar 204 is connected to a second logical output terminal 207. The second diffusion bar 202 operates as the source of the first N channel FET device 90*l*N and the source of the second N channel FET device 90*m*N.

The second P-type portion 220 is connected to the positive potential metal line 224 by means of the via contact 400, so as to operate as the source for both the first P channel FET device 90*l*P and the second P channel FET device 90*m*P. The first diffusion bar 200 is connected to the first P-type portion 218 by means of the via contact 404. The third diffusion bar 204 is connected to the third P-type portion 222 by means of the via contact 405.

The first gate electrode 206 is connected to the third P-type portion 222 by means of the via contact 210, the metal line 403, and the via contact 216. The second gate electrode 208 is connected by means of the via contact 212, the metal line 402, and the via contact 214 to the first P-type portion 218.

In this manner, an improved flip-flop circuit having a reduced layout area is obtained.

Although specific embodiments of the invention have been disclosed, it will be understood by those of skill in the art that the foregoing and other changes in form and detail may be made therein without departing from the spirit and the scope of the invention.

Having thus described our invention, what we claim as new, and desire to secure by Letters Patent is:

1. A method for fabricating a stacked complementary metal oxide silicon field effect transistor device comprising the steps of:

depositing a layer of phosphosilicate glass on top of the gate electrode of an N channel field effect transistor device formed in the surface of a monocrystalline silicon substrate having source and drain diffusions in said substrate on either side of said gate;

depositing a layer of P-type polycrystalline silicon over said phosphosilicate glass layer, extending over said source and drain diffusions and physically contacting the drain diffusion on the surface of said monocrystalline silicon substrate of said N channel device;

heating said polycrystalline silicon layer including the portion contacting said substrate to a recrystallization temperature;

cooling and recrystallizing said polycrystalline silicon layer into a monocrystalline silicon form having a lattice orientation epitaxially reoriented to the lattice orientation of said monocrystalline semiconductor substrate; and heating said phosphosilicate glass layer so as to diffuse phosphorus atoms from said phosphosilicate glass layer upwardly into said silicon layer, forming an N-type region which is juxtaposed with said gate electrode and is self-aligned to said gate electrode, forming the channel region of a P channel field effect transistor device, the source and drain regions of which being formed on either side of said channel region;

whereby an upper, P channel field effect transistor device is formed in said silicon layer, which shares said gate electrode with said N channel device.

2. A method for fabricating a stacked complementary metal oxide silicon field effect transistor device comprising the steps of:

depositing a layer of phosphosilicate glass on top of the gate electrode of an N channel field effect transistor device formed in the surface of a monocrystalline silicon substrate;

depositing a layer of P-type polycrystalline silicon over said phosphosilicate glass layer and extending over and physically contacting the drain diffusion on the surface of said monocrystalline silicon substrate of said N channel device;

heating said polycrystalline silicon layer including the portion contacting said drain region of said N channel device, to a recrystallization temperature;

cooling and recrystallizing said polycrystalline silicon layer into a monocrystalline silicon form having a lattice orientation epitaxially reoriented to the lattice orientation of said monocrystalline semiconductor substrate; and heating said phosphosilicate glass layer so as to diffuse phosphorus atoms from said first phosphosilicate glass layer upwardly into said silicon layer, forming an N-type region which is juxtaposed with said gate electrode and is self-aligned to said gate electrode, forming the channel region of a P channel field effect transistor device, the source and drain regions of which being formed on either side of said channel regions;

whereby an upper, P channel field effect transistor device is formed in said silicon layer, which shares said gate electrode with said N channel device.

3. A method for fabricating a stacked complementary metal oxide silicon field effect transistor device comprising the steps of:

depositing a layer of phosphosilicate glass on top of the gate electrode of an N channel field effect transistor device formed in the surface of a monocrystalline silicon substrate having source and drain diffusions in said substrate on either side of said gate;

depositing a layer of polycrystalline silicon over said phosphosilicate glass layer, extending over said source and drain diffusions and physically contacting the drain diffusion on the surface of said monocrystalline silicon substrate of said N channel device;

heating said polycrystalline silicon layer including the portion contacting said substrate to a recrystallization temperature;

cooling and recrystallizing said polycrystalline silicon layer into a monocrystalline silicon form having a lattice orientation epitaxially reoriented to the lattice orientation of said monocrystalline semiconductor substrate;

heating said phosphosilicate glass layer so as to diffuse phosphorus atoms from said phosphosilicate glass layer upwardly into said silicon layer, forming an N-type region which is juxtaposed with said gate electrode and is self-aligned to said gate electrode; and doping regions in said silicon layer on both sides of said gate of said N channel device as P-type, forming respective source and drain regions of an upper, P channel field effect transistor device in said silicon layer;

whereby said upper P channel device shares the same gate with said lower N channel device.

4. A method for fabricating a stacked complementry metal oxide silicon field effect transistor device comprising the steps of:

depositing a layer of phosphosilicate glass on top of the gate electrode of an N channel field effect transistor device formed in the surface of a monocrystalline silicon substrate having source and drain diffusions in said substrate on either side of said gate;

depositing a layer of P-type polycrystalline silicon over said phosphosilicate glass layer, extending over said source and drain diffusions and physically contacting the drain diffusion on the surface of said monocrystalline silicon substrate of said N channel device;

heating said polycrystalline silicon layer including the portion contacting said substrate to a recrystallization temperature and heating said phosphosilicate glass layer so as to diffuse phosphorus atoms from said phosphosilicate glass layer upwardly into said silicon layer, forming an N-type region which is juxtaposed with said gate electrode and is self-aligned to said gate electrode, forming the channel region of a P channel field effect transistor device, the source and drain regions of which being formed on either side of said channel region; and cooling and recrystallizing said polycrystalline silicon layer into a monocrystalline silicon form having a lattice orientation epitaxially reoriented to the lattice orientation of said monocrystalline semiconductor substrate;

whereby an upper, P channel field effect transistor device is formed in said silicon layer, which shares said gate electrode with said N channel device.

5. A method for fabricating a stacked complementary metal oxide silicon field effect transistor device comprising the steps of:

depositing a layer of phosphosilicate glass on top of the gate electrode of an N channel field effect transistor device formed in the surface of a monocrysalline silicon substrate;

deposition a layer of P-type polycrystalline silicon over said phosphosilicate glass layer and extending over and physically contacting the drain diffusion on the surface of said monocrystalline silicon substrate of said N channel device;

heating said polycrystalline silicon layer including that portion contacting said drain region of said N channel device, to a recrystallization temperature and heating said phosphosilicate glass layer so as to diffuse phosphorus atoms from said first phosphosilicate glass layer upwardly into said silicon layer, forming an N-type region which is juxtaposed with said gate electrode and is self-aligned to said gate electrode; and cooling and recrystallizing said polycrystalline silicon layer into a monocrystalline silicon form having a lattice orientation epitaxially reoriented to the lattice orientation of said monocrystalline semiconductor substrate;

whereby an upper, P channel field effect transistor device is formed in said silicon layer, which shares said gate electrode with said N channel device.

6. A method for fabricating a stacked complementary metal oxide silicon field effect transistor device comprising the steps of:

depositing a layer of phosphosilicate glass on top of the gate electrode of an N channel field effect transistor device formed in the surface of a monocrystalline silicon substrate having source and drain diffusions in said substrate on either side of said gate;

depositing a layer of polycrystalline silicon over said phosphosilicate glass layer, extending over said source and drain diffusions and physically contacting the drain diffusion on the surface of said monocrystalline silicon substrate of said N channel device;

heating said polycrystalline silicon layer including the portion contacting said substrate to a recrystallization temperature and heating said phosphosilicate glass layer so as to diffuse phosphorus atoms from said phosphosilicate glass layer upwardly into said silicon layer, forming an N-type region which is juxtaposed with said gate electrode and is self-aligned to said gate electrode;

cooling and recrystallizing said polycrystalline silicon layer into a monocrystalline silicon form having a lattice orientation epitaxially reoriented to the lattice orientation of said monocrystalline semiconductor substrate; and doping regions in said silicon layer on both sides of said gate of said N channel device as P-type, forming respective source and drain regions of an upper, P channel field effect transistor device in said silicon layer;

whereby said upper P channel device shares the same gate with said lower N channel device.

7. A method for fabricating a stacked complementary metal oxide silicon field effect transistor device comprising the steps of:

depositing a layer of phosphosilicate glass on top of the gate electrode of an N channel field effect transtor device formed in the surface of a monocrystalline silicon substrate;

depositing a layer of P-type polycrystalline silicon over said phosphosilicate glass layer and extending over and physically contacting the drain diffusion on the surface of said monocrystalline silicon substrate of said N channel device;

heating said polycrystalline silicon layer including the portion contacting said drain region of said N channel device to a recrystallization temperature;

cooling and recrystallizing said polycrystalline silicon layer into a monocrystalline silicon form having a lattice orientation epitaxially reoriented to the lattice orientation of said monocrystalline semiconductor substrate;

heating said phosphosilicate glass layer so as to diffuse phosphorus atoms from said first phosphosilicate glass layer upwardly into said silicon layer, forming an N-type region which is juxtaposed with said gate electrode and is self-aligned to said gate electrode; and selectively etching the portion of said silicon layer in said drain region of said N-type device to selectively sever the electrical connection therewith;

whereby an upper, P channel field effect transistor device is formed in said silicon layer, which shares said gate electrode with said N channel device and whose drain selectively makes electrical contact with said drain of said N channel device selectively forming a complementary metal oxide silicon inverter.

8. A method for fabricating stacked complementary metal oxide silicon field effect transistor device comprising the steps of:

depositing a layer of phosphosilicate glass on top of the gate electrode fo an N channel field effect transistor device formed in the surface of a monocrystalline silicon substrate;

depositing a layer of P-type polycrystalline silicon over said phosphosilicate glass layer and extending over and physically contacting the drain diffusion on the surface of said monocrystalline silicon substrate of said N channel FET device;

heating said polycrystalline silicon layer including the portion contacting said drain region of said N channel device, to a recrystallization temperature and heating said phosphosilicate glass layer as to diffuse phosphorus atoms from said first phosphosilicate glass layer upwardly into said silicon layer, forming an N-type region which is juxtaposed with said gate electrode and self-aligned to said gate electrode;

cooling and recrystallizing said polycrystalline silicon layer into a monocrystalline silicon form having a lattice orientation epitaxially reoriented to the lattice orientation of said monocrystalline semiconductor substrate; and selectively etching the portion of said silicon layer in said drain region of said N channel device to selectively sever the electrical connection therewith;

whereby an upper, P channel field effect transistor device is formed in said silicon layer, which shares said gate electrode with said N channel device and whose drain selectively makes electrical contact with said drain of said N channel device selectively forming a complementary metal oxide silicon inverter.

* * * * *

UNITED STATES PATENT AND TRADEMARK OFFICE
CERTIFICATE OF CORRECTION

PATENT NO. : 4,467,518
DATED : 8/28/84
INVENTOR(S) : Jai P. Bansal, et al

It is certified that error appears in the above-identified patent and that said Letters Patent are hereby corrected as shown below:

Column 16, line 62 - Change "regions" to --region--.

Column 18, line 8 - Change "deposition" to --depositing--.

Signed and Sealed this

Twenty-sixth Day of February 1985

[SEAL]

*Attest:*

DONALD J. QUIGG

*Attesting Officer*   *Acting Commissioner of Patents and Trademarks*